(12) United States Patent
Hishikawa et al.

(10) Patent No.: US 7,928,600 B2
(45) Date of Patent: Apr. 19, 2011

(54) POWER SOURCE DEVICE AND MAGNETIC RESONANCE IMAGING APPARATUS USING THE SAME

(75) Inventors: Shingo Hishikawa, Kashiwa (JP); Takuya Domoto, Noda (JP)

(73) Assignee: Hitachi Medical Corporation, Tokyo (JP)

( * ) Notice: Subject to any disclaimer, the term of this patent is extended or adjusted under 35 U.S.C. 154(b) by 768 days.

(21) Appl. No.: 11/993,818

(22) PCT Filed: Jun. 30, 2006

(86) PCT No.: PCT/JP2006/313102
§ 371 (c)(1),
(2), (4) Date: Dec. 21, 2007

(87) PCT Pub. No.: WO2007/004565
PCT Pub. Date: Jan. 11, 2007

(65) Prior Publication Data
US 2010/0045113 A1  Feb. 25, 2010

(51) Int. Cl.
*H02J 3/00* (2006.01)
(52) U.S. Cl. .......................................................... 307/17
(58) Field of Classification Search ...................... 307/17
See application file for complete search history.

(56) References Cited

FOREIGN PATENT DOCUMENTS

| JP | 63-92263 | 4/1988 |
|---|---|---|
| JP | 63-190556 | 8/1988 |
| JP | 2-184266 | 7/1990 |
| JP | 5-159893 | 6/1993 |
| JP | 7-65987 | 3/1995 |
| JP | 7-57094 | 6/1995 |
| JP | 7-313489 | 12/1995 |
| JP | 9-190898 | 7/1997 |
| JP | 2004-350471 | 12/2004 |

*Primary Examiner* — Jared J Fureman
*Assistant Examiner* — Dru M Parries
(74) *Attorney, Agent, or Firm* — Cooper & Dunham LLP

(57) ABSTRACT

A DC high voltage power source is constituted by an AC-DC converting means (4, 6) that converts a voltage of a commercial AC power source (3) to a DC voltage and steps up the converted DC voltage, a DC-AC converting means (7) that converts the DC voltage stepped up by the previous means to an AC voltage, two insulating transformer (8, 9) that steps up the AC voltage converted by the previous converting means while insulating each others and a series connection of DC voltages obtained after converting the output voltages from the transformers to DCs and smoothing the same. The DC voltage of the DC high voltage power source is used as the power source to current amplifiers (19, 20, 21) constituted by a multi level PWM inverter circuit (18) of 3 levels and the currents flowing through X axis, Y axis and Z axis gradient magnetic field coil (15, 16, 17) in an MRI apparatus connected to these current amplifiers as loads are controlled by a switching control device (18q) so as to meet with current command values (22c1, 22c2, 22c3) from a sequencer 22 in the MRI apparatus. As a result, plural DC high voltage power sources necessary for the multi level PWM inverter is constituted by a comparatively simple circuit, in addition, while suppressing loss in the power sources, a small sized and highly accurate high voltage and large current power source device and a magnetic resonance imaging apparatus using the same are provided.

15 Claims, 8 Drawing Sheets

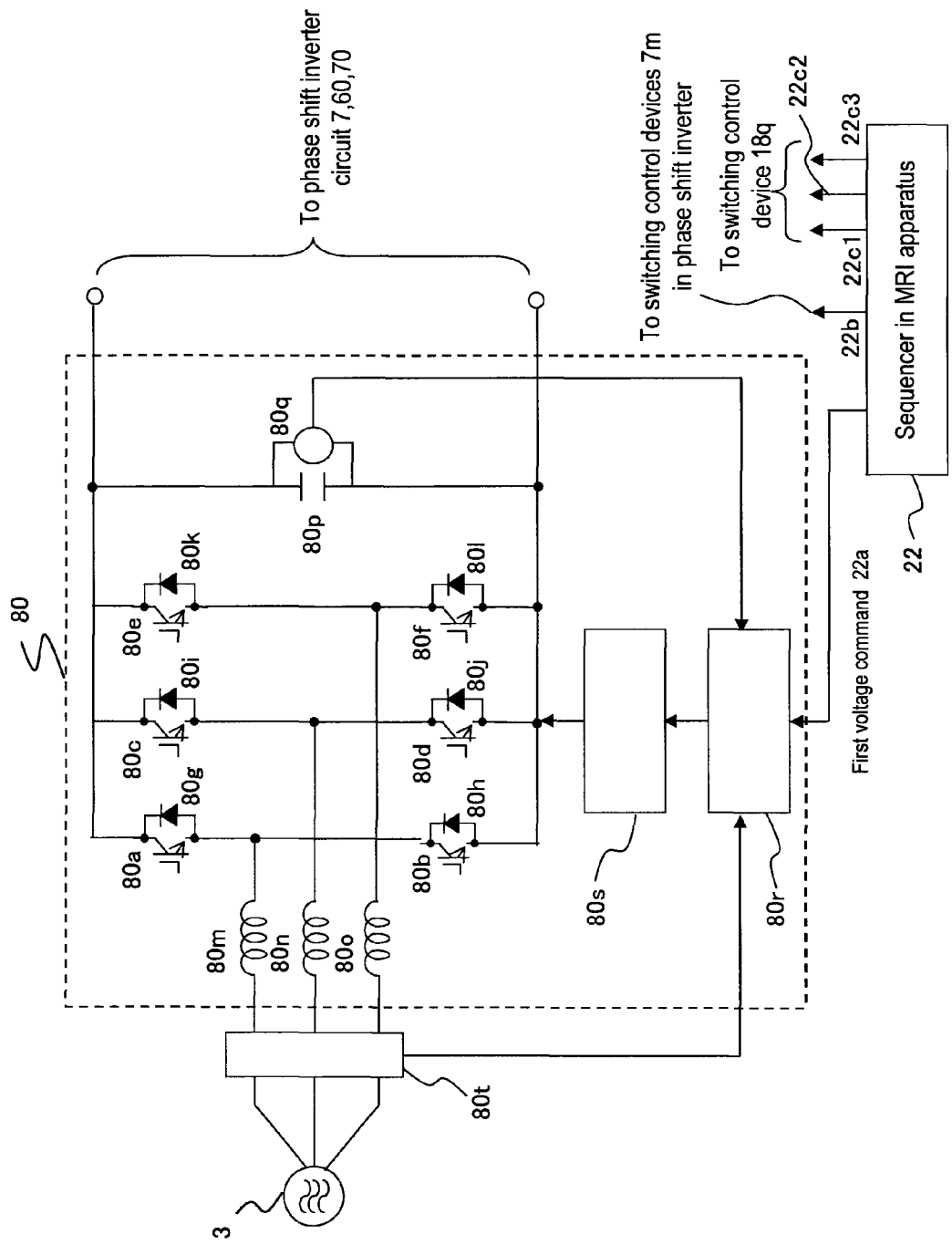

POWER SOURCE DEVICE AND MAGNETIC RESONANCE IMAGING APPARATUS USING THE SAME

FIELD OF THE INVENTION

The present invention relates to a power source device and in particular relates to a power source device that is suitable for varieties of power sources necessary for generating static magnetic fields, gradient magnetic fields and high frequency magnetic fields for a magnetic resonance imaging apparatus (herein below will be called as an MRI apparatus) requiring a high voltage and a large current, and an MRI apparatus using the same.

CONVENTIONAL ART

An MRI apparatus is one that which pulse like high frequency magnetic fields are applied to an inspection object which is placed in static magnetic fields, detects nuclear magnetic resonance signals generated from the inspection object and forms such as spectra and images based on the detected signals.

The MRI apparatus is provided with, as its magnetic fields generating coils, super-conducting coils for generating static magnetic fields, gradient magnetic field coils for generating the gradient magnetic fields being superposed on the static magnetic fields and further high frequency coils for generating the high frequency magnetic fields.

For these magnetic field generating coils, respective power source devices of which magnitude and timing of current to be fed thereto are controllable are provided in order to generate magnetic fields of predetermined intensities.

In such MRI apparatus, the magnetic field intensity of such as the static magnetic fields, the gradient magnetic fields and the high frequency magnetic fields greatly affects such as on noises in finally obtained images and on image taking time.

Further, in order to obtain images useful for diagnosis in a short time, as power sources for the magnetic fields in the MRI apparatus, a highly stable and highly accurate power source device is required of which current flowing through the magnetic coils for generating the magnetic fields shows a short rise and fall time and shows free of such as ripples and variation after the rising.

In particular, in these days, it is required to devise shortening the image taking time by accelerating the image taking, and in order to accelerate the image taking from a view point of the gradient magnetic fields, the intensity of the pulse like gradient magnetic fields has to be increased further than the conventional one and the rise and fall time has to be further shortened.

For these purposes, since a large current is required to be fed to the gradient magnetic coils with a short rise and fall time, as a power source for the gradient magnetic coils, a large current and high voltage power source of roughly 300 [A]~400 [A] and of about 2000 [V] is required.

For example, JP-A-7-313489 discloses a power source device for gradient magnetic fields in an MRI apparatus that is capable of outputting a large current and high voltage to meet these requirements. The power source device for gradient magnetic fields is constituted by DC voltage power sources each having an output voltage different from each other that are serially connected in multi stages and a multi level diode clamped type PWM inverter connected to these DC voltage power sources, and to the output side of the multi level diode clamped type PWM inverter, is connected a series connection of gradient magnetic field coils in the MRI apparatus and a linear amplifier that linearly amplifies a command signal of a current to be fed to the gradient magnetic field coils outputted from a sequencer in the MRI apparatus to form a coil current and is capable of feeding the current to the gradient magnetic field coils.

However, JP-A-7-313489 absolutely nowhere refers to any circuit configurations of the respective DC voltage power sources serially connected in multi stages that constitute the power source device for the gradient magnetic fields.

Further, in order to constitute the DC voltage power sources serially connected in multi stages, for example, when a full bridge inverter circuit as disclosed, for example, in JP-A-5-159893 is used, a problem arose that the circuit scale thereof enlarges because not less than eight sets of transistors and diodes are necessitated.

An object of the present invention is to provide a small sized and highly accurate high voltage and large current power source device in which DC voltage power sources serially connected in multi stages necessary for a multi level diode clamped type PWM inverter to which output terminal such as gradient magnetic field coils in an MRI apparatus are connected as a load are constituted with a comparatively simple circuit and further while suppressing loss in the power sources, and an MRI apparatus using the same.

SUMMARY OF THE INVENTION

The above object is achieved by the following measures.

(1) In a power source device provided with a DC voltage power source means constituted by connecting in series plural DC voltage sources, a current amplifying means of a multi level inverter using DC voltage of the DC voltage power source means as a power source, at the output of the current amplifying means a load is connected and a current control means that controls the current amplifying means so that a current flowing through the load assumes a current command value, the DC voltage power source means comprises an AC-DC converting and voltage stepping up means that converts a commercial AC power source voltage to a DC voltage and steps up the converted DC voltage, a DC-AC converting means that converts the DC voltage stepped up by the previous means to an AC voltage and plural insulating transformers which step up the AC voltage converted by the converting means while insulating each other, and is constituted by connecting in series DC voltages that are obtained by converting the output voltages of the transformers to DC and smoothing the same.

In the power source device constituted in the above manner, with the AC-DC converting and voltage stepping up means, the voltage obtained through full wave rectification of the commercial AC power source voltage is stepped up to a higher voltage, the stepped up DC voltage is converted to AC voltages by the DC-AC converting means, these AC voltages are stepped up by the transformers while insulating each other and after smoothing the same and connecting the DC voltages in series, the DC voltage power source is obtained and constituted, thus, if an operating frequency of the AC-DC converting and voltage stepping up means and the DC-AC converting means, which use semiconductor switches is shifted to a high frequency side to about 20 kHz, the sizes of the insulating transformers and smoothing means are reduced extremely, thereby, the size and cost of the DC voltage power source means, which is insulated from the commercial AC power source can be reduced.

(2) The DC-AC converting means is provided with not less than two sets of full bridge inverter circuits in which an arm is constituted by connecting in series two switch means each is constituted by a semiconductor switch and a diode connected in antiparallel to the semiconductor switch and at least three arms are connected in parallel and which are constituted by at least one common arm among the plural arms and the remaining arms and a phase difference control means which controls respective semiconductor switches in the common arm of the respective full bridge inverter circuits by providing a conduction phase different from that of the corresponding semiconductor switches in the remaining arms, and with the phase difference control means, the conduction phase of the semiconductor switches in the remaining arms is controlled in a delayed phase and/or in an advanced phase with respect to the conduction phase of the semiconductor switches in the common arm.

In the DC-AC converting means (which corresponds to a phase shift inverter circuit 7, 60 and 70 in embodiments), since the not less than two sets of full bridge inverter circuits are constituted by the plural arms and the conduction phase of the semiconductor switches in the remaining arms is controlled in a delayed phase and/or in an advanced phase with respect to the conduction phase of the semiconductor switches in the common arm, the number of the semiconductor switches is reduced and moreover, the loss in the semiconductor switches is reduced, thereby, a small sized DC-AC converting means can be constituted.

(3) The phase difference control means (which corresponds to second switching control devices 7m and 60k in embodiments) is further provided with a DC voltage detecting means that detects a DC voltage of the DC voltage power source means, and the phase difference in the full bridge inverter circuits is feed back controlled so that a difference between a detection value detected by the previous means and a first target voltage command value (which corresponds to a second voltage command value 22b and a third voltage command value 22d in embodiments) assumes zero.

Thereby, the DC voltage of the DC power source means shows a stable power source voltage without variation and a stable current with a short rise time can be fed to a load by the multi level inverter using the DC power source.

(4) The AC-DC converting and voltage stepping up means is constituted by being provided with means for converting the commercial AC power source voltage to a DC, a step up voltage type chopper circuit (which corresponds to a step up voltage type chopper circuit 6 in embodiments) that steps up the DC voltage converted by the previous means and a conduction rate control means that controls a conduction rate of the semiconductor switches in the chopper circuit.

By switching controlling the conduction rate (ratio of conductive period and non-conductive period of a semiconductor switch) of the semiconductor switches in the step up voltage type chopper circuit the output voltage thereof can be stepped up to any desired voltages.

Further, the conduction rate control means is further provided with means for detecting an output voltage of the step up voltage type chopper circuit and the conduction rate of the semiconductor switches can be feed back controlled so that a difference between a detection value detected by the previous means and a second target voltage command value (which corresponds to a first voltage command value 22a in embodiments) assumes zero.

Through controlling in this manner, a variation in the output voltage of the chopper circuit is prevented and the input DC power source voltage to the DC-AC converting means can be kept at a constant voltage which can otherwise vary due to such as a variation of the commercial AC power source voltage and others, thereby, the DC-AC converting means can be operated stably.

(5) Further, another embodiment of the AC-DC converting and voltage stepping up means is constituted by being provided with a bridge circuit in which plural pairs of semiconductor switches are connected in parallel, diodes connected in antiparallel to the respective semiconductor switches in the plural pairs, reactors connected between AC terminals of the bridge circuit and the commercial AC power source and a pulse width modulation control means that performs pulse width modulation control on the semiconductor switches (which corresponds to a fourth AC-DC converter 80 in an embodiment and the pulse width modulation control means therein corresponds to a fourth switching control device 80r).

The pulse width modulation control means is further provided with means for detecting an output voltage of the AC-DC converting and voltage stepping up means and the conduction pulse width of the semiconductor switches can be feed back controlled so that a difference between a detection value detected by the previous means and a third target voltage command value (which corresponds to a first voltage command value 22a in embodiments) assumes zero.

In addition, the pulse width modulation control means is further provided with means for detecting a phase voltage and a phase current of the commercial AC power source and controls the phases of the phase voltage and the phase current to meet each other.

Through the use of such AC-DC converting and voltage stepping up means, the output voltage can be stepped up to a same voltage as of the AC-DC converting and voltage stepping up means as explained in (4) and further the number of the elements constituting the circuit is reduced. Further, the power factor is improved to lessen the apparent power and the amount of current flowing through the semiconductor switches is permitted to be small as well as the capacity of the commercial AC power source installation can be reduced.

(6) In an MRI apparatus using a power source device provided with a DC voltage power source means constituted by connecting in series plural DC voltage sources, a current amplifying means of a multi level inverter using DC voltage of the DC voltage power source means as a power source, at the output of the current amplifying means a load is connected and a current control means that controls the current amplifying means so that a current flowing through the load assumes a current command value, the load is coils for generating magnetic fields in the MRI apparatus and as the power source device for the MRI apparatus, any one of the devices as indicated in (1)~(5) is used.

With thus constituted power source device for the coils for generating the magnetic fields, a highly accurate high voltage and large current can be obtained while being insulated from the commercial AC power source, thereby, the intensity of the pulse like gradient magnetic fields can be increased and the magnetic fields having a short rise and fall time can be obtained, accordingly, the image taking speed by the MRI apparatus can be accelerated and the image taking time can be shortened.

BRIEF DESCRIPTION OF THE DRAWINGS

FIG. 8 is a circuit configuration diagram of a major part of a power source device representing a fourth embodiment according to the present invention, which is applied to gradient magnetic field coils, as a load thereof, of an MRI apparatus.

BEST MODES FOR CARRYING OUT THE INVENTION

Preferable embodiments of a power source device and an MRI apparatus using the same according to the present invention will be explained in detail with reference to the drawings as attached.

Figure 1:
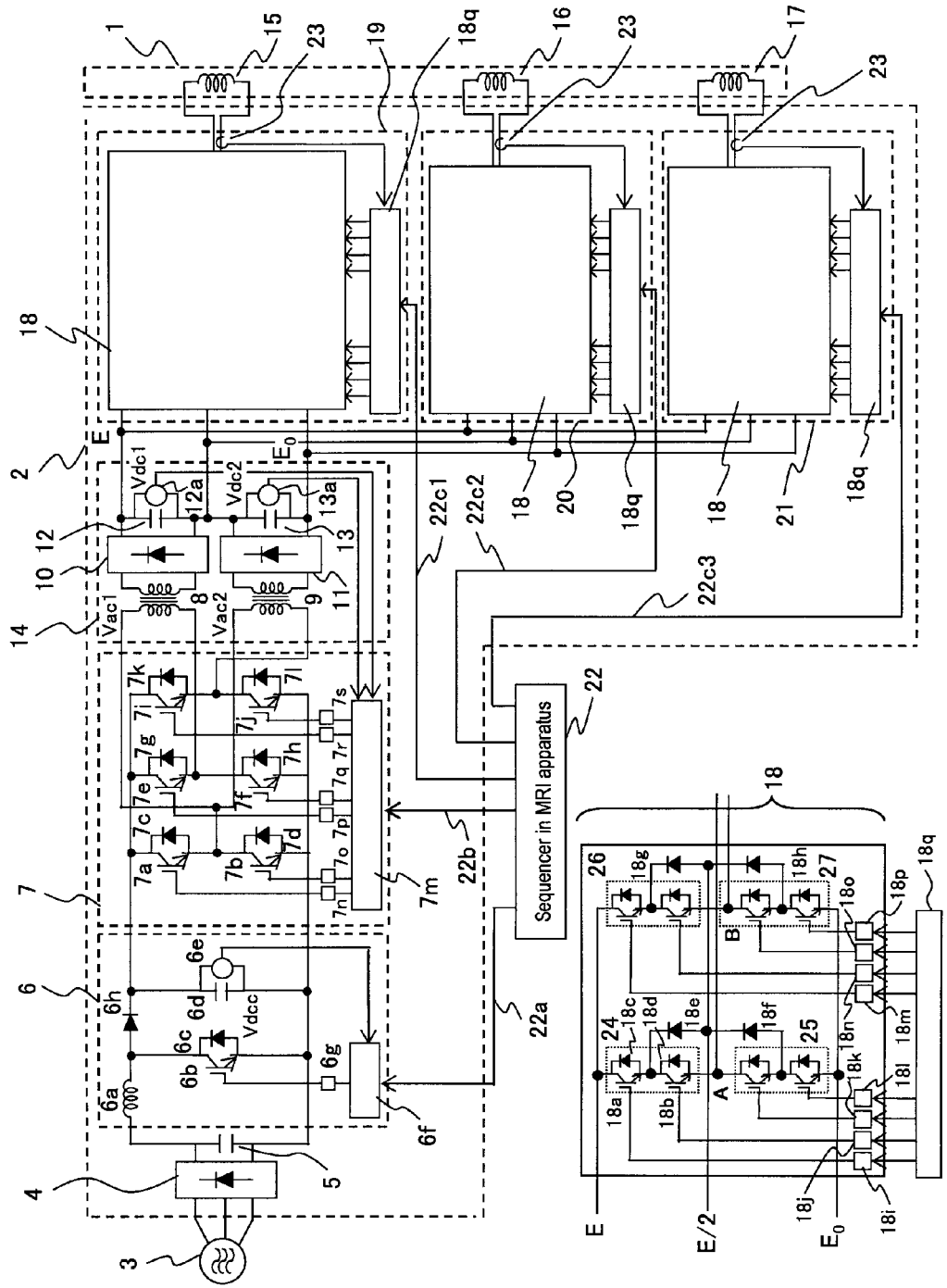
FIG. 1 is a circuit configuration diagram of a power source device representing a first embodiment according to the present invention, which is applied to gradient magnetic field coils, as a load thereof, of an MRI apparatus.

FIG. 1 is a circuit configuration diagram of a power source device for gradient magnetic fields in an MRI apparatus representing a first embodiment for a power source device according to the present invention.

A gradient magnetic field power source device 2 is constituted to receive an electric power supply from a three phase AC power source 3 and to feed an electric current to a gradient magnetic field coil 1 serving as a load, and is constituted by being provided with a first AC-DC converter 4 that is connected to the three phase AC power source 3 and converts a three phase AC voltage to a DC voltage, a first smoothing capacitor 5 that is connected to the output side of the AC-DC converter 4 and smoothes the DC voltage, a DC-DC converter (herein below will be called as a voltage step up type chopper circuit) 6 that is connected to the first smoothing capacitor 5 and steps up the smoothed DC voltage to a predetermined DC voltage, a DC-AC converter (herein below will be called as a phase shift inverter circuit) 7 that is constituted by three arms, is connected to the output side of the voltage step up type chopper circuit 6 and converts the stepped up DC voltage into two single phase AC voltages, an AC-DC stepping up and converting unit (which produces two DC voltages Vdc1 and Vdc2) 14, which is constituted by two insulating transformers 8 and 9 that are connected to the output side of the phase shift inverter circuit 7 and insulate the respective two single phase AC voltages each other, a second AC-DC converter 10 and a third AC-DC converter 11 that are connected respectively to the secondary side of the transformers 8 and 9 and convert the insulated two AC voltages to DC voltages and a second smoothing capacitor 12 and a third smoothing capacitor 13 which smooth these converted DC voltages, and current amplifiers 19, 20 and 21 each receives the two DC voltages from the AC-DC stepping up and converting unit 14 and is constituted by a multi level PWM (Pulse Width Modulation, herein below will be abbreviated as PWM) inverter circuit 18 of three levels and is connected to one of an X axis coil 15, a Y axis coil 16 and a Z axis coil 17 for the gradient magnetic coil 1.

The voltage step up type chopper circuit 6 is what is for stepping up to a voltage higher than the voltage obtained by converting the three phase AC voltage of the three phase AC power source 3 into a DC voltage by the first AC-DC converter 4 and is constituted by a reactor 6a, a semiconductor switch 6b using an insulated gate type bipolar transistor (Insulated Gate Bipolar Transistor, herein below will be abbreviated as IGBT), a diode 6c connected in antiparallel to the semiconductor switch 6b, a fourth smoothing capacitor 6d, a first voltage detector 6e for detecting a voltage Vdcc at the smoothing capacitor 6d and a first switching control device 6f that performs a switching control of the semiconductor switch 6b so that a first voltage command value 22a outputted from a sequencer 22 of an MRI apparatus meets with the voltage Vdcc detected by the first voltage detector 6e as shown in the drawing.

Further, 6g is a circuit for driving the semiconductor switch 6b after amplifying a switching control signal outputted from a switching control device 6f to a predetermined value.

The voltage step up type chopper circuit 6 thus constituted is what causes the semiconductor switch 6b to be conductive and non-conductive in a predetermined period and steps up the DC voltage smoothed by the first smoothing capacitor 5, and when the semiconductor switch 6b is rendered conductive, a circuit of the first smoothing capacitor 5—the reactor 6a—the semiconductor switch 6b is formed and causes to flow a current through the reactor 6a to store electromagnetic energy in the reactor 6a.

When the semiconductor switch 6b is rendered non-conductive under this condition, the electromagnetic energy stored in the reactor 6a charges the fourth smoothing capacitor 6d through a diode 6h.

Through this operation, namely, through switching control of the semiconductor switch 6b between conductive and non-conductive in a predetermined period, the voltage of the fourth smoothing capacitor 6d can be stepped up more than the voltage of the first smoothing capacitor 5, namely, the voltage obtained when the voltage of the three phase power source 3 is full wave rectified, and the first switching control device 6f switching controls the semiconductor switch 6b so that the detection value detected by the first voltage detector 6e meets the first voltage command value 22a outputted from the sequencer 22 of the MRI apparatus.

In this manner, the voltage of the fourth smoothing capacitor 6d corresponding to the output voltage of the voltage step up type chopper 6, namely, the DC source voltage Vdcc inputted to the phase shift inverter circuit 7 can be stepped up to any voltages through the switching control of the semiconductor switch 6b between conductive and non-conductive in a predetermined period as referred to above.

The phase shift inverter circuit 7 is constituted by an arm 1 formed by semiconductor switches 7a and 7b using an IGBT and diodes 7c and 7d connected in antiparallel thereto, an arm 2 formed by semiconductor switches 7e and 7f using an IGBT and diodes 7g and 7h connected in antiparallel thereto, an arm 3 formed by semiconductor switches 7i and 7j using an IGBT and diodes 7k and 7l connected in antiparallel thereto and a second switching control device 7m that switching controls these semiconductor switches, and with the arm 1 and arm 2, a first full bridge circuit is constituted and with the arm 1 and arm 3, a second full bridge circuit is constituted.

Namely, the arm 1 is used in common for the first and second full bridge inverter circuits, thereby, the number of arms for constituting these full bridge inverter circuits is reduced from four to three and the number of the semiconductor switches can be devised to decrease. Further 7n~7s respectively are circuits for driving the semiconductor switches 7a, 7b, 7e, 7f, 7i and 7j after amplifying switching control signals outputted from the second switching control device 7m to a predetermined value.

For the control of the output AC voltage of the first and second full bridge inverter circuits, by making use of a phase difference control technology through the phase shift PWM (Pulse Width Modulation) control as disclosed in JP-A-63-190556, the first AC output voltage Vac1 is controlled through the phase difference control of the arms 1 and 2 and the second AC output voltage Vac2 is controlled through the phase difference control of the arms 1 and 3.

Figure 2:
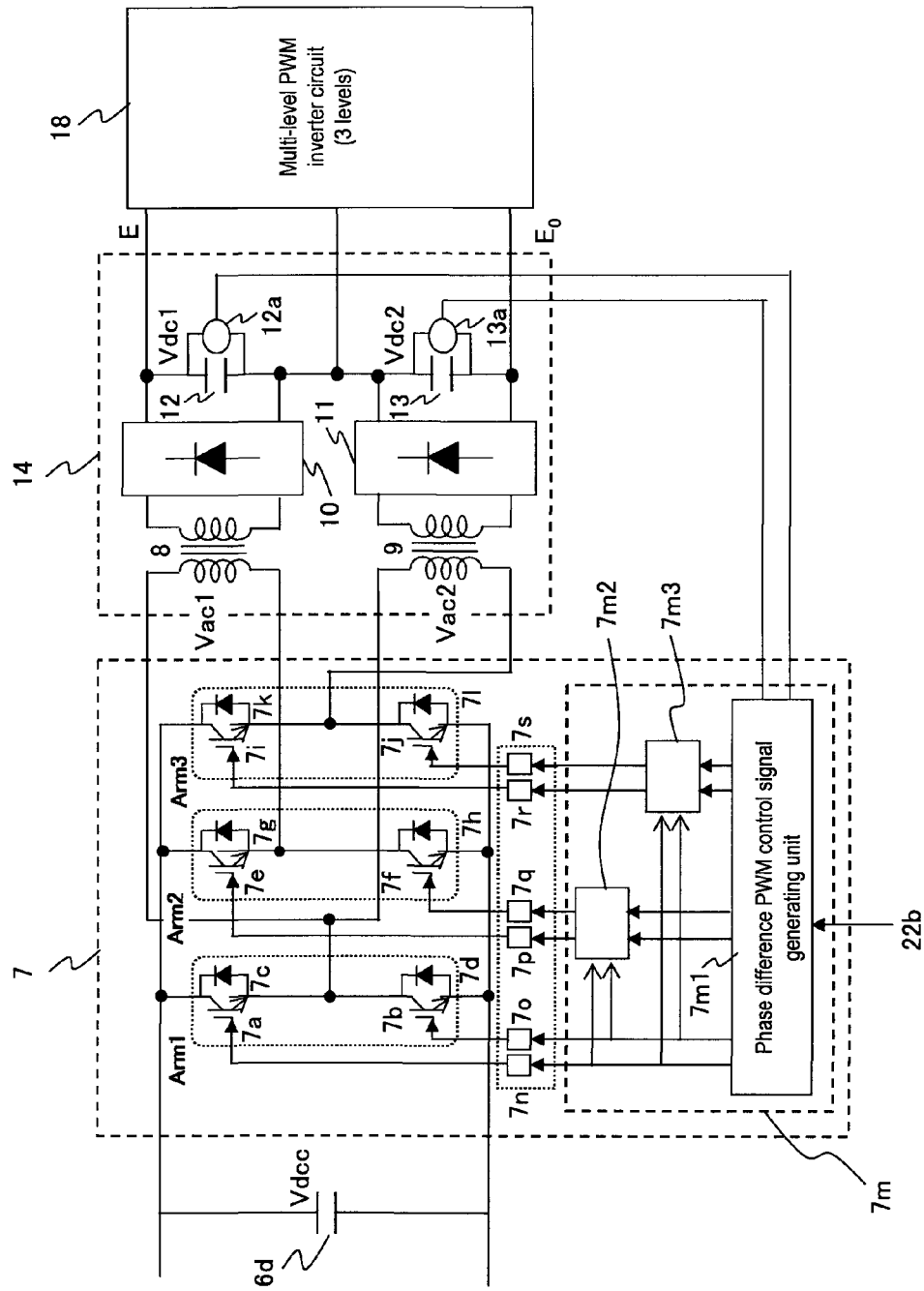
FIG. 2 is a detailed diagram of a phase shift inverter circuit of the power source device representing the first embodiment as shown in FIG. 1.
Figure 3:
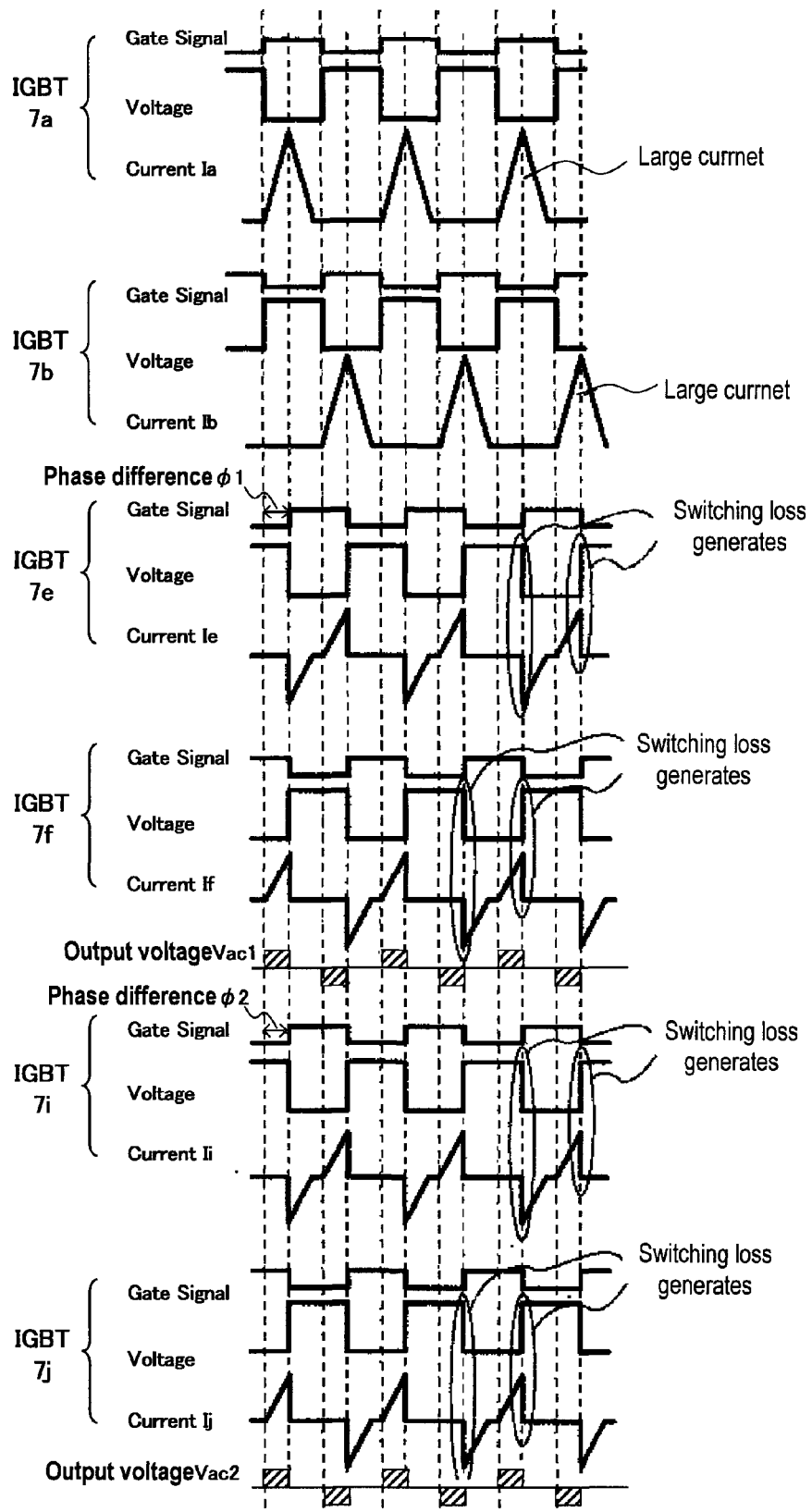
FIG. 3 is a diagram for explaining an operation of the phase shift inverter circuit as shown in FIG. 2 according to a first control method.
Figure 4:
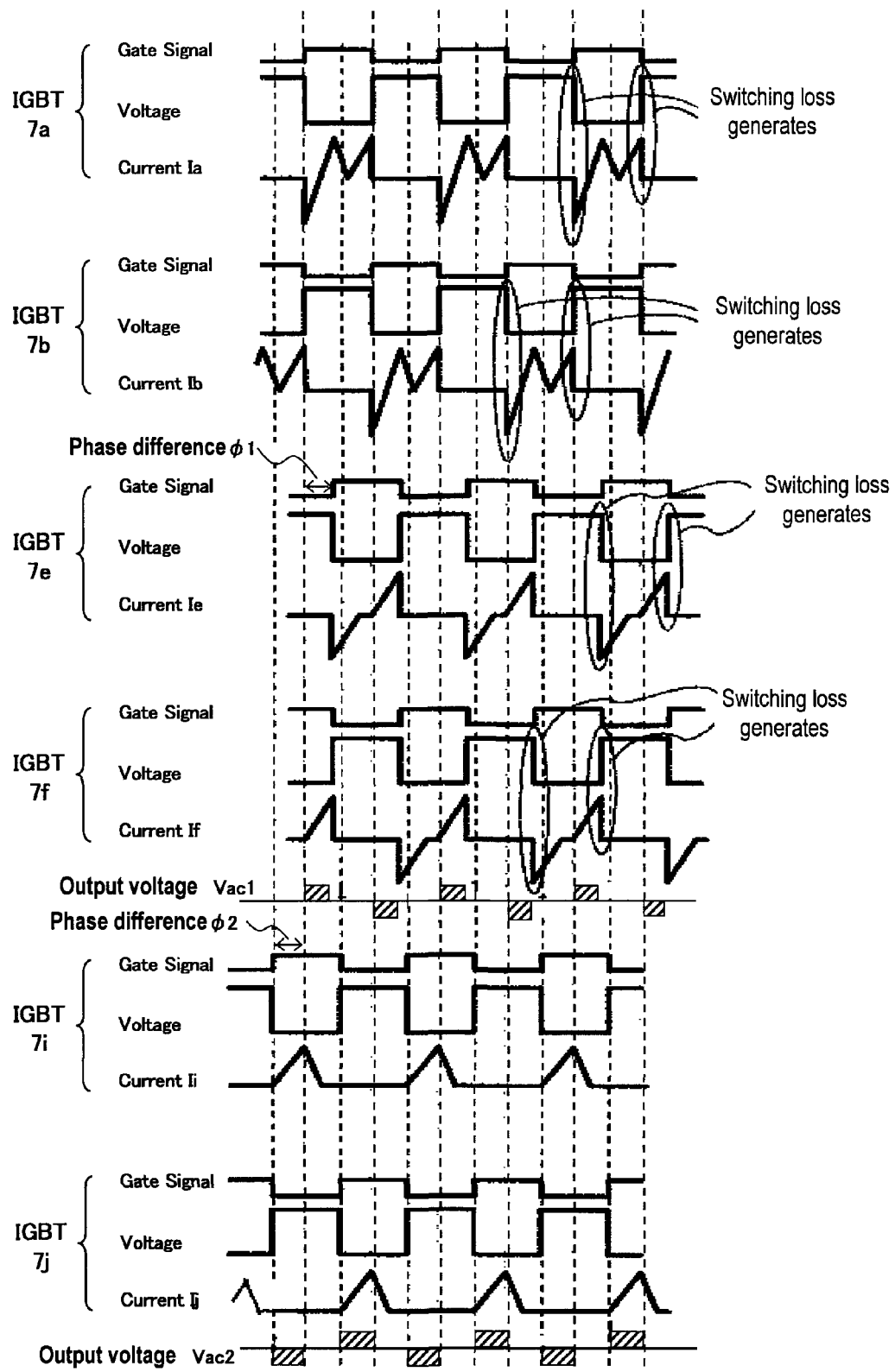
FIG. 4 is a diagram for explaining an operation of the phase shift inverter circuit as shown in FIG. 2 according to a second control method.
Figure 5:
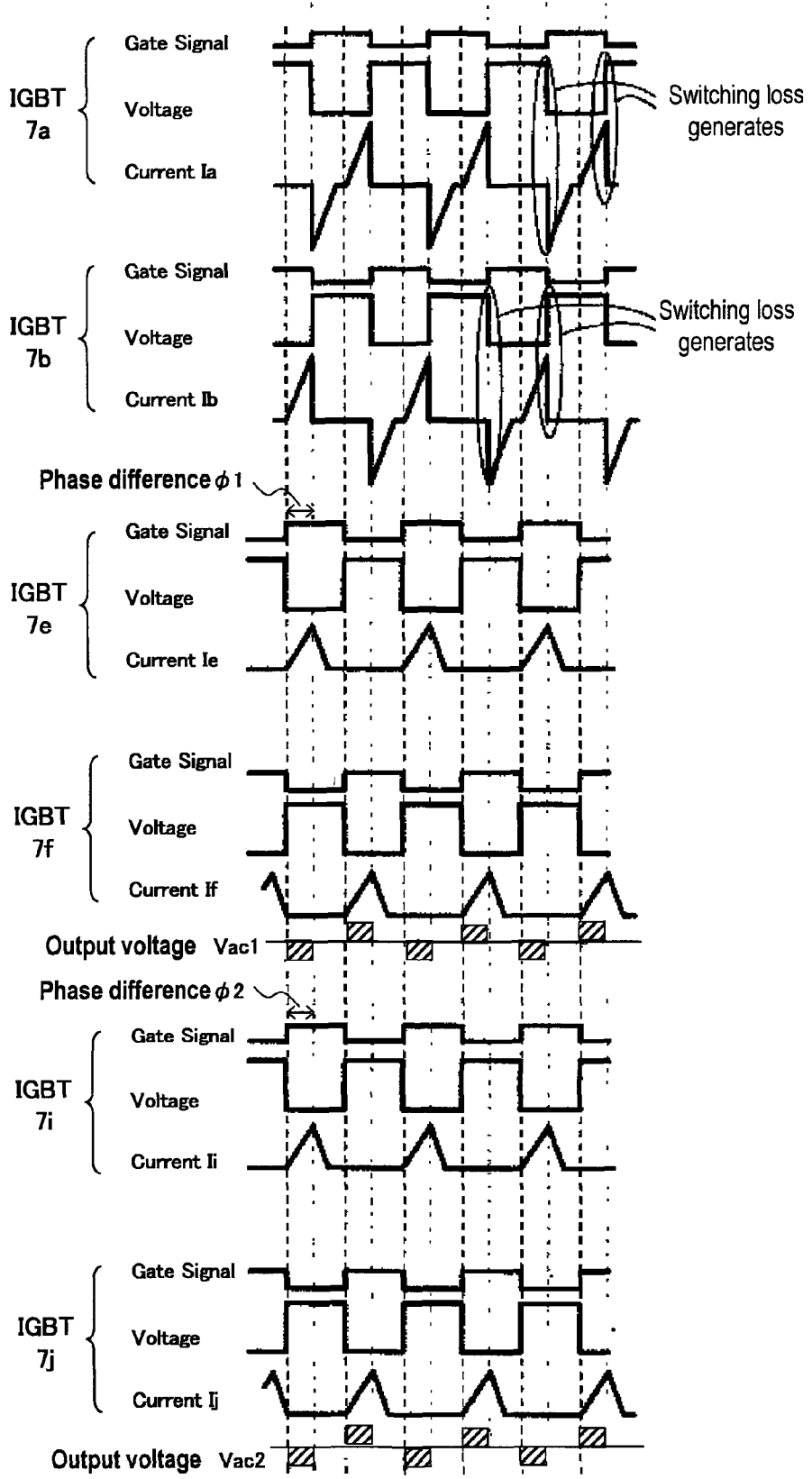
FIG. 5 is a diagram for explaining an operation of the phase shift inverter circuit as shown in FIG. 2 according to a third control method.

FIG. 2 shows a block constitutional diagram of the second switching control device 7m in the phase shift inverter circuit 7 in FIG. 1 together with the arms 1~3, the drive circuits 7n~7s and the AC-DC stepping up and converting unit 14, and the control operation of the phase shift inverter 7, which is one of major parts of the present invention will be explained in detail with reference to relationships between the operation timing of the semiconductor switches 7a, 7b, 7e, 7f, 7i and 7j and the output voltages Vac1 and Vac2 as shown in FIGS. 3, 4 and 5.

In FIG. 2, the second switching control device 7m is constituted by a phase difference PWM control signal producing unit 7m1 that produces a control signal for controlling the DC high voltages Vdc1 and Vdc2 corresponding to the output voltage of the AC-DC voltage step up and converting unit 14, which will be explained later, to meet the second voltage command value 22b from the sequencer 22 in the MRI apparatus, a first phase shift unit 7m2 that causes the conductive phase of the semiconductor switches 7e and 7f in the arm 2 in a delayed phase with respect to the conductive phase of the semiconductor switches 7a and 7b in the arm 1 and a second phase shift unit 7m3 that causes the conductive phase of the semiconductor switches 7i and 7j in the arm 3 in a delayed phase or an advanced phase with respect to the conductive phase of the semiconductor switches 7a and 7b in the arm 1.

FIG. 3 is a control timing diagram of the phase shift inverter circuit 7 according to a first control method, wherein gate signals for the respective semiconductor switches, voltages applied to the semiconductor switches, currents flowing through the semiconductor switches and output voltages Vac1 and Vac2 from the phase shift inverter circuit 7 are shown.

In the instant first control method, the output voltage is controlled in a manner that with respect to the conductive phase of the semiconductor switches 7a and 7b in the arm 1 common for the first and second full bridge inverter circuits, the conductive phases of the semiconductor switches 7e and 7f in the arm 2 and the semiconductor switches 7i and 7j in the arm 3 are set in delayed phase differences 1 and 2, in that a control signal produced in the phase difference PWM control signal generating unit 7m1 in the second switching control device 7m as shown in FIG. 2 is shifted in the delayed phase difference φ1 by the first phase shift unit 7m2 and with this control signal the semiconductor switches 7e and 7f in the arm 2 are conduction controlled, and the control signal produced in the phase difference PWM control signal generating unit 7m1 is shifted in the delayed phase difference φ2 by the second phase shift unit 7m3 and with this control signal the semiconductor switches 7i and 7j in the arm 3 are conduction controlled, thereby, the two AC output voltages Vac1 and Vac2 are respectively controlled independently.

Namely, with respect to the semiconductor switch 7a in the arm 1 constituting the first full bridge inverter circuit, the conductive phase of the semiconductor switch 7f in the arm 2 is delayed by φ1 and with respect to the semiconductor switch 7b in the arm 1 of which phase is delayed by 180° from that of the semiconductor switch 7a in the arm 1, the conductive phase of the semiconductor switch 7e in the arm 2 is delayed by φ1, and by varying the delayed phase difference φ1 from 0° to 180° in an electrical angle, the first AC output voltage Vac1 can be varied to any AC voltages between 0 to the maximum voltage.

Further, when the semiconductor switch 7f is rendered non-conductive, because of the inductance of the load, the current flowing through a circuit of the DC power source Vdcc—the semiconductor switch 7a in the arm 1—the insulating transformer 8—the semiconductor switch 7f in the arm 2 until now moves to the diode 7g connected in antiparallel to the semiconductor switch 7e in the arm 2 (which will be called as commutation herein after), and the current flowing through the load continues to flow through a circuit of the diode 7g connected in antiparallel to the semiconductor switch 7e in the arm 2—the semiconductor switch 7a in the arm 1 and the insulating transformer 8 and the current becomes 0 at the timing when the semiconductor switch 7b in the arm 1 is rendered conductive and the semiconductor switch 7a thereof is rendered nonconductive.

Further, when the semiconductor switch 7e in the arm 2 is rendered nonconductive, the current flowing through a circuit of the DC power source Vdcc—the semiconductor switch 7e in the arm 2—the insulating transformer 8—the semiconductor switch 7b in the arm 1 is commutated to the diode 7h connected in antiparallel to the semiconductor switch 7f in the arm 2 and the current flowing through the load continues to flow through a circuit of the diode 7h connected in antiparallel to the semiconductor switch 7f in the arm 2—the insulating transformer 8 and the semiconductor switch 7b in the arm 1 and the current becomes zero at the timing when the semiconductor switch 7a in the arm 1 is rendered conductive and the semiconductor switch 7b thereof is rendered nonconductive.

In such a way, the negative current component in the current Ie of the semiconductor switch 7f and in the current If of the semiconductor switch 7f as shown in FIG. 3 is the current flowing through the diodes 7g and 7h connected respectively in antiparallel to the semiconductor switches 7e and 7f and only positive current flows through the semiconductor switches 7e and 7f.

In the like manner as above, with respect to the semiconductor switch 7a in the arm 1 constituting the second full bridge inverter circuit, the conductive phase of the semiconductor switch 7j in the arm 3 is delayed by φ2 and with respect to the semiconductor switch 7b in the arm 1 of which phase is delayed by 180° from that of the semiconductor switch 7a in the arm 1, the conductive phase of the semiconductor switch 7i in the arm 3 is delayed by φ2, and by varying the delayed phase difference 42 from 0° to 180° in an electrical angle, the second AC output voltage Vac2 can be varied to any AC voltages between 0 to the maximum voltage.

Further, like the first full bridge inverter circuit constituted by the arms 1 and 2, the negative current component in the current Ii of the semiconductor switch 7i and in the current Ij of the semiconductor switch 7j as shown in FIG. 3 is the current flowing through the diodes 7k and 7l connected respectively in antiparallel to the semiconductor switches 7i and 7j and only positive current flows through the semiconductor switches 7i and 7j.

As has been explained above, in the first control method, current Ia, which is a sum current of the current flowing through the semiconductor switch 7f in the arm 2, the current flowing through the semiconductor switch 7j in the arm 3, the current flowing through the diode 7g connected in antiparallel to the semiconductor switch 7e in the arm 2 and the current flowing through the diode 7h connected in antiparallel to the semiconductor switch 7i in the arm 3, flows through the semiconductor switch 7a in the arm 1, and current Ib, which is also a sum current of the current flowing through the semiconductor switch 7e in the arm 2 and through the semiconductor switch 7i in the arm 3 and the current flowing through the diode 7h connected in antiparallel to the semiconductor switch 7f in the arm 2 and through the diode 7l connected in antiparallel to the semiconductor switch 7j in the arm 3, flows through the semiconductor switch 7b in the arm 1.

In this manner, although the sum currents of the current flowing through the semiconductor switches 7e and 7f in the arm 2 and the semiconductor switches 7i and 7j in the arm 3 and the current flowing through the diodes 7g, 7h, 7k and 7l connected respectively in antiparallel to these semiconductor switches respectively flow through the semiconductor switches 7a and 7b in the arm 1, at the time of switching of the semiconductor switches 7a and 7b in the arm 1, the respective currents Ia and Ib flowing through the semiconductor switches 7a and 7b and the voltages thereat are nearly zero as shown in the drawing, for this reason, almost no switching loss is generated in the semiconductor switches 7a and 7b.

Accordingly, although a large current flows through the semiconductor switches 7a and 7b in the arm 1 in comparison with the semiconductor switches in other arms, since the switching loss is dominant among the losses in the semiconductor switches performing the PWM control with high frequency, it is sufficient only if the conduction loss is taken into account for the semiconductor switches 7a and 7b in the arm 1.

On the other hand, although a switching loss is caused in the semiconductor switches in the arms 2 and 3, since the current flowing therethrough is small, the switching loss therein is likely small.

As a result, in the first control method, the losses caused in the semiconductor switches in the arm 1 and in the semiconductor switches in the other arms are distributed.

Namely, it is sufficient if the inverter circuit is installed while putting weight on the conduction loss for the semiconductor switches in the arm 1 and weight on the switching loss for the semiconductor switches in the other arms.

Further, although not illustrated, each of the semiconductor switches are generally provided with a surge voltage suppressing means constituted by such as a capacitor and a resistor for suppressing a surge voltage caused during switching, however, in the first control method, such surge voltage suppressing means is provided only for the semiconductor switches in the arms 2 and 3 in which the switching loss is caused and no such surge voltage suppressing means is provided for the semiconductor switches in the arm 1 in which almost no switching loss is caused, thereby, the circuit installation is simplified.

Further, in view of the characteristics of losses caused in the semiconductor switches in the respective arms, for example, when high speed semiconductor switches are selected for the semiconductor switches in the arms 2 and 3 in which the switching loss is caused and semiconductor switches with small conduction loss are selected for the semiconductor switches in the arm 1, the loss and heating in the semiconductor switches are effectively suppressed and the installation of the phase shift inverter circuit can be simplified while reducing the size thereof.

FIG. 4 is a control timing diagram of the phase shift inverter circuit 7 according to a second control method, wherein gate signals for the respective semiconductor switches, voltages applied to the semiconductor switches, currents flowing through the semiconductor switches and output voltages Vac1 and Vac2 from the phase shift inverter circuit 7 are shown.

In the instant second control method, the output voltage is controlled in a manner that with respect to the conductive phase of the semiconductor switches 7a and 7b in the arm 1 common for the first and second full bridge inverter circuits, the conductive phases of the semiconductor switches 7e and 7f in the arm 2 are set in a delayed phase difference $\phi 1$, and those of the semiconductor switches 7i and 7j in the arm 3 are set in an advanced phase difference $\phi 2$, in that a control signal produced in the phase difference PWM control signal generating unit 7m1 in the second switching control device 7m as shown in FIG. 2 is shifted in the delayed phase difference $\phi 1$ by the first phase shift unit 7m2 and with this control signal the semiconductor switches 7e and 7f in the arm 2 are conduction controlled, and the control signal produced in the phase difference PWM control signal generating unit 7m1 is shifted in the advanced phase difference $\phi 2$ by the second phase shift unit 7m3 and with this control signal the semiconductor switches 7i and 7j in the arm 3 are conduction controlled, thereby, the two AC output voltages Vac1 and Vac2 are respectively controlled independently.

Namely, with respect to the semiconductor switch 7a in the arm 1 constituting the first full bridge inverter circuit, the conductive phase of the semiconductor switch 7f in the arm 2 is delayed by $\phi 1$ and with respect to the semiconductor switch 7b in the arm 1 of which phase is delayed by 180° from that of the semiconductor switch 7a in the arm 1, the conductive phase of the semiconductor switch 7e in the arm 2 is delayed by $\phi 1$, and by varying the delayed phase difference $\phi 1$ from 0° to 180° in an electrical angle, the first AC output voltage Vac1 can be varied to any AC voltages between 0 to the maximum voltage.

Further, when the semiconductor switch 7f is rendered non-conductive, because of the inductance of the transformer, the current flowing through a circuit of the DC power source Vdcc—the semiconductor switch 7a in the arm 1—the insulating transformer 8—the semiconductor switch 7f in the arm 2 until now commutates to the diode 7g connected in antiparallel to the semiconductor switch 7e in the arm 2, and the current flowing through the load continues to flow through a circuit of the diode 7g connected in antiparallel to the semiconductor switch 7e in the arm 2—the semiconductor switch 7a in the arm 1 and the insulating transformer 8 and the current becomes 0 at the timing when the semiconductor switch 7b in the arm 1 is rendered conductive and the semiconductor switch 7a thereof is rendered nonconductive.

Further, when the semiconductor switch 7e in the arm 2 is rendered nonconductive, the current flowing through a circuit of the DC power source Vdcc—the semiconductor switch 7e in the arm 2—the insulating transformer 8—the semiconductor switch 7b in the arm 1 is commutated to the diode 7h connected in antiparallel to the semiconductor switch 7f in the arm 2 and the current flowing through the load continues to flow through a circuit of the diode 7h connected in antiparallel to the semiconductor switch 7f in the arm 2—the insulating transformer 8—the semiconductor switch 7b in the arm 1 and the current becomes zero at the timing when the semiconductor switch 7a in the arm 1 is rendered conductive and the semiconductor switch 7b thereof is rendered nonconductive.

In such a way, the negative current component in the current Ie of the semiconductor switch 7e and in the current If of the semiconductor switch 7f as shown in FIG. 4 is the current flowing through the diodes 7g and 7h connected respectively in antiparallel to the semiconductor switches 7e and 7f and only positive current flows through the semiconductor switches 7e and 7f.

On the other hand, with respect to the semiconductor switch 7a in the arm 1 constituting the second full bridge inverter circuit, the conductive phase of the semiconductor switch 7j in the arm 3 is advanced by φ2 and with respect to the semiconductor switch 7b in the arm 1 of which phase is delayed by 180° from that of the semiconductor switch 7a in the arm 1, the conductive phase of the semiconductor switch 7i in the arm 3 is advanced by φ2, and by varying the delayed phase difference φ2 from 0° to 180° in an electrical angle, the second AC output voltage Vac2 can be varied to any AC voltages between 0 to the maximum voltage.

In the second full bridge inverter circuit operating in the above manner, different from the first control method, since the semiconductor switch 7a in the arm 1 is rendered nonconductive prior to the semiconductor switch 7j in the arm 3, the current flowing through the load is commutated to the diode 7d connected in antiparallel to the semiconductor switch 7b in the arm 1 and continues to flow through a circuit of the semiconductor switch 7j in the arm 3—the insulating transformer 9—the diode 7d connected in anti parallel to the semiconductor switch 7b in the arm 1, and the current gradually decreases even after a gate signal is inputted to the semiconductor switch 7b in the arm 1 until the semiconductor switch 7i in the arm 3 is rendered conductive and is rendered to zero before the semiconductor switch 7i is rendered conductive.

With regard to the current flowing through the semiconductor switch 7j in the arm 3 in the second full bridge inverter circuit, the same is applied as above, in that since the semiconductor switch 7b in the arm 1 is rendered nonconductive prior to the semiconductor switch 7i in the arm 3, the current flowing through the load is commutated to the diode 7c connected in antiparallel to the semiconductor switch 7a in the arm 1 and continues to flow through a circuit of the semiconductor switch 7i in the arm 3—the insulating transformer 9—the diode 7c connected in anti parallel to the semiconductor switch 7a in the arm 1, and the current gradually decreases even after a gate signal is inputted to the semiconductor switch 7a in the arm 1 until the semiconductor switch 7j in the arm 3 is rendered conductive and is rendered to zero before the semiconductor switch 7j is rendered conductive.

In such a manner, when the conduction phase of the semiconductor switches in the arm 3 is set in an advanced phase with respect to the conduction phase of the semiconductor switches in the arm 1, a period when current flows through the diodes 7c and 7d connected respectively in antiparallel to the semiconductor switches 7a and 7b in the arm 1 appears, however, no period when current flows through the diodes 7k and 7l connected respectively in antiparallel to the semiconductor switches 7i and 7j in the arm 3 appears and the current flows through the respective semiconductor switches as shown in FIG. 4.

The loss in the arm 2 according to the instant second control method is the same as that of the first control method, however, the switching loss in the arm 1 according to the second control method is large in comparison with that of the first control method and the conduction loss therein is small. Further, in the arm 3 no switching loss is caused with the same current as in the first control method, therefore, in total the second control method is a control method with small loss.

FIG. 5 is a control timing diagram of the phase shift inverter circuit 7 according to a third control method, wherein gate signals for the respective semiconductor switches, voltages applied to the semiconductor switches, currents flowing through the semiconductor switches and output voltages Vac1 and Vac2 from the phase shift inverter circuit 7 are shown.

In the instant third control method, the output voltage is controlled in a manner that with respect to the conductive phase of the semiconductor switches 7a and 7b in the arm 1 common for the first and second full bridge inverter circuits, the conductive phases of the semiconductor switches 7e and 7f in the arm 2 are set in an advanced phase difference φ1, and those of the semiconductor switches 7i and 7j in the arm 3 are also set in an advanced phase difference φ2, in that a control signal produced in the phase difference PWM control signal generating unit 7m1 in the second switching control device 7m as shown in FIG. 2 is shifted in the advanced phase difference φ1 by the first phase shift unit 7m2 and with this control signal the semiconductor switches 7e and 7f in the arm 2 are conduction controlled, and the control signal produced in the phase difference PWM control signal generating unit 7m1 is shifted in the advanced phase difference φ2 by the second phase shift unit 7m3 and with this control signal the semiconductor switches 7i and 7j in the arm 3 are conduction controlled, thereby, the two AC output voltages Vac1 and Vac2 are respectively controlled independently.

Namely, with respect to the semiconductor switch 7a in the arm 1 constituting the first full bridge inverter circuit, the conductive phase of the semiconductor switch 7f in the arm 2 is advanced by φ1 and with respect to the semiconductor switch 7b in the arm 1 of which phase is delayed by 180° from that of the semiconductor switch 7a in the arm 1, the conductive phase of the semiconductor switch 7e in the arm 2 is advanced by φ1, and by varying the advanced phase difference φ1 from 0° to 180° in an electrical angle, the first AC output voltage Vac1 can be varied to any AC voltages between 0 to the maximum voltage.

In the first full bridge inverter circuit operating in the above manner, different from the first and second control methods, since the semiconductor switch 7a in the arm 1 is rendered nonconductive prior to the semiconductor switch 7f in the arm 2, the current flowing through the load is commutated to the diode 7d connected in antiparallel to the semiconductor switch 7b in the arm 1 and continues to flow through a circuit of the semiconductor switch 7f in the arm 2—the diode 7d connected in antiparallel to the semiconductor switch 7b in the arm 1—the insulating transformer 8 and the current gradually decreases even after a gate signal is inputted to the semiconductor switch 7b in the arm 1 until the semiconductor switch 7e in the arm 3 is rendered conductive and is rendered to zero before the semiconductor switch 7e is rendered conductive.

In the like manner, since the semiconductor switch 7b in the arm 1 is rendered nonconductive prior to the semiconductor switch 7e in the arm 2, the current flowing through the load is commutated to the diode 7c connected in antiparallel to the semiconductor switch 7a in the arm 1 and continues to flow through a circuit of the diode 7c connected in anti parallel to the semiconductor switch 7a in the arm 1—the semiconductor switch 7e in the arm 2—the insulating transformer 8 and the current gradually decreases even after a gate signal is inputted to the semiconductor switch 7a in the arm 1 until the semiconductor switch 7f in the arm 2 is rendered conductive and is rendered to zero before the semiconductor switch 7f is rendered conductive.

The arms 1 and 3 in the second full bridge inverter circuit are also operated in the like manner as those in the first full bridge inverter circuit and the current flows through the respective semiconductor switches as shown in FIG. 5.

In such a manner, when the conduction phase of the diodes 7g and 7h connected in antiparallel to the semiconductor switch 7e and 7f in the arm 2 and the semiconductor switches in the arm 3 is set in an advanced phase with respect to the conduction phase of the semiconductor switches in the arm 1, a period when current flows through the diodes 7c and 7d connected respectively in antiparallel to the semiconductor switches 7a and 7b in the arm 1 appears, however, no period when current flows through the arm 2 and the diodes 7k and 7l connected respectively in antiparallel to the semiconductor switches 7i and 7j in the arm 3 appears.

Therefore, a switching loss is caused in the arm 1 and the current therein is large. In contrast, the current in the arms 2 and 3 is small and no switching loss is caused therein. The present control method is a method of concentrating the loss into the arm 1.

As has been explained hitherto, through constituting the two full bridge inverter circuits with three arms, the number of semiconductor switches is reduced as well as the number of circuits for driving the semiconductor switches and of the wirings therefor can also be reduced.

Further, since the losses in the semiconductor switches consisting of the switching loss and the conduction loss are different from arm to arm and for the arms with no switching loss, no surge voltage suppressing means for the semiconductor switches are necessary, through heat radiating installation (an installation such as heat sinks, fins and air cooling fans for cooling the semiconductor switches) in view of the losses caused in every semiconductor switches in the respective arms such as selection of semiconductor switches having a small conduction loss for the semiconductor switches in the arms showing a large conduction loss, minimization of surge voltage suppressing means and proper selection of semiconductor switches, a small sized and inexpensive inverter circuit can be realized.

In the AC-DC stepping up and converting unit 14, the two single phase AC voltages Vac1 and Vac2 converted by the phase shift inverter circuit 7 are inputted to the insulating transformers 8 and 9, the output voltages of these insulating transformers 8 and 9 are respectively converted into DC voltages by the second and third AC-DC converters (full wave rectifiers) 10 and 11 and further after smoothing the DC voltages by the second and third smoothing capacitors 12 and 13 the DC power source voltages Vdc1 and Vdc2 for the current amplifiers 19, 20 and 21, which will be explained later, are obtained, thereby, the AC-DC stepping up and converting unit 14 is insulated from the three phase AC power source 3.

The two DC power source voltages Vdc1 and Vdc2 are connected in series to form a DC high voltage power source for the multi level PWM inverter circuit 18, which will be explained later, therefore, Vdc1 and Vdc2 have to be a same value.

For this reason, insulating voltage detectors 12a and 12b are provided which are capable of detecting the Vdc1 and Vdc2 while insulating each other and the second switching control device 7m performs a switching control for the semiconductor switches 7a, 7b, 7e, 7f, 7i and 7j in the phase shift inverter circuit 7 so that the detection values detected by these detectors meet with the second voltage command value 22b outputted from the sequencer 22 in the MRI apparatus.

In addition, when the operating frequency of the phase shift inverter circuit 7 is increased to (about 20 kHz), the size and cost of the insulating transformers 8 and 9 in the AC-DC stepping up and converting unit 14 can be reduced.

The current amplifiers 19, 20 and 21 are respectively constituted by a multi level PWM inverter circuit 18 of 3 levels and the currents from the multi level PWM inverter circuits 18 are fed respectively to the X axis coil 15, the Y axis coil 16 and the Z axis coil 17 in the gradient magnetic field coils 1 representing the load.

3 level voltages of 0 level, ½ E level and E of maximum level using the DC power source voltages Vdc1 and Vdc2 as the power source (Vdc1=Vdc2=E/2) are applied from the multi level PWM inverter circuits 18 to the X axis coil 15, the Y axis coil 16 and the Z axis coil 17 in the gradient magnetic field coils 1 representing the load while being changed over by the current command values 22c1, 22c2 and 22c3 from the sequencer 22 of the MRI apparatus.

The current amplifier 19 is constituted by being provided with the multi level PWM inverter circuit 18 connected in parallel with the second smoothing capacitor (voltage Vdc1) 12 and the third smoothing capacitor (voltage Vdc2) 13 which are respectively connected in series and serve as an input DC voltage source therefor, wherein to the output side of the multi level PWM inverter circuit 18 the X axis coil 15 is connected, a current detector 23 for detecting an output current (current flowing through the gradient magnetic field coil 15) of the current amplifier 19 and a switching control device 18q which receives the current command value 22c1 from the sequencer 22 in the MRI apparatus and the current detection value outputted from the current detector 23 and drive controls the multi level PWM inverter circuit 18 so that the difference of both values assumes zero.

Further, 18i~18p are respectively circuits for driving the respective semiconductor switches 18a and 18b in arms 24~27 in the multi level PWM inverter circuit 18 after amplifying switching control signals outputted from the switching control device 18q to predetermined values.

The current amplifier 20 is also constituted in the same manner as above, wherein to the output side of the multi level PWM inverter circuit 18 the Y axis coil 16 is connected, and is constituted by being provided with a current detector 23 for detecting an output current of the current amplifier 20 and a switching control device 18q which receives the current command value 22c2 and the current detection value outputted of the current detector 23 and drive controls the multi level PWM inverter circuit 18 so that the difference of both values assumes zero.

Further, the current amplifier 21 is also constituted in the same manner as above, wherein to the output side of the multi level PWM inverter circuit 18 the Z axis coil 17 is connected, and is constituted by being provided with a current detector 23 for detecting an output current of the current amplifier 21 and a switching control device 18q which receives the current command value 22c3 and the current detection value outputted of the current detector 23 and drive controls the multi level PWM inverter circuit 18 so that the difference of both values assumes zero.

The multi level PWM inverter circuit 18 of 3 levels is constituted in such a manner that to the inputs thereof DC voltage sources E (voltage=Vdc1+Vdc2) and E0 are connected and any voltage waveforms are outputted at output terminals A and B.

Further, the 3 level PWM inverter circuit 18 divides the DC voltage E-E0 between the DC voltage sources into two (E/2) and includes four sets of arms 24~27 constituted by connecting in series two pairs of semiconductor switches 18a and 18b of IGBTs and diodes 18c and 18d connected in antiparallel thereto, and the four sets of arms are connected in a full bridge.

Then, between the connection point (potential at level 2) of the second smoothing capacitor 12 and the third smoothing capacitor 13 and the respective connection points of the semiconductor switches in the respective arms 24~27 in the full bridge structure, diodes 18e, 18f, 18g and 18h are connected to thereby constitute a multi level diode clamped type PWM converter.

Namely, between the connection point of the semiconductor switches 18a and 18b in the arms 24 and the connection point of the second smoothing capacitor 12 and the third smoothing capacitor 13, the diode 18e is connected as shown in the drawing, between the connection point of the semiconductor switches 18a and 18b in the arms 25 and the connection point of the second smoothing capacitor 12 and the third smoothing capacitor 13, the diode 18f is connected, between the connection point of the semiconductor switches 18a and 18b in the arms 26 and the connection point of the second smoothing capacitor 12 and the third smoothing capacitor 13, the diode 18g is connected and between the connection point of the semiconductor switches 18a and 18b in the arms 27 and the connection point of the second smoothing capacitor 12 and the third smoothing capacitor 13, the diode 18h is connected.

Herein, when the semiconductor switches 18a and 18b in the arm 24 are rendered conductive, voltage +E is outputted at the output terminal A, when the semiconductor switch 18b in the arm 24 and the semiconductor switch 18a in the arm 25 are rendered conductive, voltage +E/2 is outputted at the output terminal A, further, when the semiconductor switches 18a and 18b in the arm 25 are rendered conductive, voltage 0 is outputted at the output terminal A, in this manner, voltages of three levels can be outputted at the output terminal A.

Further, the above is true with regard to the output terminal B, resultantly, five voltages from −E to +E (−E, −E/2, 0, +E/2 and E) are outputted as voltages between the output terminals A and B.

Further, through performing the PWM control thereon any desired voltages from −E to +E can be outputted.

Since 3 level PWM inverter circuit 18 divides the DC voltage source into Vdc1 and Vdc2, the respective arms 24~27 likely divide the same with the semiconductor switches 18a and 18b and the respective connection points thereof are connected via the diodes 18e, 18f, 18g and 18h, thereby, only the divided DC voltage component is applied to the respective semiconductor switches 18a and 18b, accordingly, even when semiconductor switches having a low withstand voltage are used, a large output can be obtained.

Further, since the current amplifiers 19~21 respectively use the multi level PWM inverter circuit 18 and with which PWM control is performed, current ripples can be reduced in comparison with when other inverters are used.

In the multi level PWM inverter circuit, for example, in the case of the 3 level PWM inverter circuit 18, when a difference appears between the divided two DC power source voltages Vdc1 and Vdc2, a difference also appears in positive and negative output voltages which causes to increase ripples in the current flowing through the load. Accordingly, in order to equalize the two DC power source voltages Vdc1 and Vdc2 and to stabilize the same, the respective output voltages from the step up chopper circuit 6 and the phase shift inverter circuit 7 are feed back controlled so as to meet with the first and second voltage command values 22a and 22b outputted from the sequencer 22 in the MRI apparatus.

As shown in FIG. 1, the voltage Vdc1 at the second smoothing capacitor 12 and the voltage Vdc2 at the third smoothing capacitor 13 are detected by the insulating voltage detectors 12a and 12b and the phase difference in the phase shift inverter circuit 7 is controlled so that the difference between these detected values and the second voltage command value 22b outputted from the sequencer 22 in the MRI apparatus assumes zero, thereby, the two DC power source voltages Vdc1 and Vdc2 can be stabilized at a same voltage.

Likely, with regard to the input DC power source voltage Vdcc to the phase shift inverter circuit 7, namely, the output voltage Vdcc of the step up chopper circuit 6, the rate of conduction and non-conduction of the semiconductor switch in the step up chopper circuit 6 is controlled so that the difference between the value detected by the voltage detector 6e and the first voltage command value 22a outputted from the sequencer 22 in the MRI apparatus assumes zero, thereby, the input DC power source voltage Vdcc to the phase shift inverter circuit 7 can be stabilized.

Further, since the DC power source voltages Vdc1 and Vdc2 of the multi level PWM inverter circuit 18 are feed back controlled by the phase shift inverter circuit 7 to stabilize the same, the output voltage of the step up chopper circuit 6 is sometimes unnecessary to be feed back controlled.

Although the sum of the DC power source voltages Vdc1 and Vdc2 is required to be a high DC voltage of about 2000 [V], according to the first embodiment of the present invention, since two elements of the step up chopper circuit 6 and the insulating transformers 8 and 9 are provided as means for stepping up the voltage, the above required voltage can be achieved by properly sharing the voltage stepping up operation between the two elements.

For example, a commercial power source voltage of 200 [V] is converted to a DC by the first AC-DC converter 4, a voltage of about 282[V] (200×√2) obtained by smoothing the converted DC voltage is stepped up three times to 864 [V] by the step up chopper circuit 6 (in view of the withstanding voltage of the semiconductor switches of IGBT) and when the stepped up voltage is further stepped up to about 2.5 times by the insulating transformers 8 and 9, the above target DC high voltage can be obtained.

In this instance, as has been explained above, when the frequency of the input voltage to the insulating transformers 8 and 9 is increased to a high frequency of about 20 kHz by the phase shift inverter circuit 7, the size of the insulating transformers 8 and 9 and the second and third smoothing capacitors can be reduced (because the capacitance thereof can be reduced).

In this manner, since the step up ratio by the step up chopper circuit 6 and the transformation ratio of the insulation transformers 8 and 9 are selected at proper values, the AC voltage of which frequency is increased by the phase shift inverter circuit 7 is inputted to the insulating transformers 8 and 9 as well as the phase shift inverter circuit 7 is constituted by the two sets of full bridge inverter circuits including three arms, the size and cost of the DC high voltage power source for the multi level PWM inverter circuit 18 can be reduced.

Figure 6:
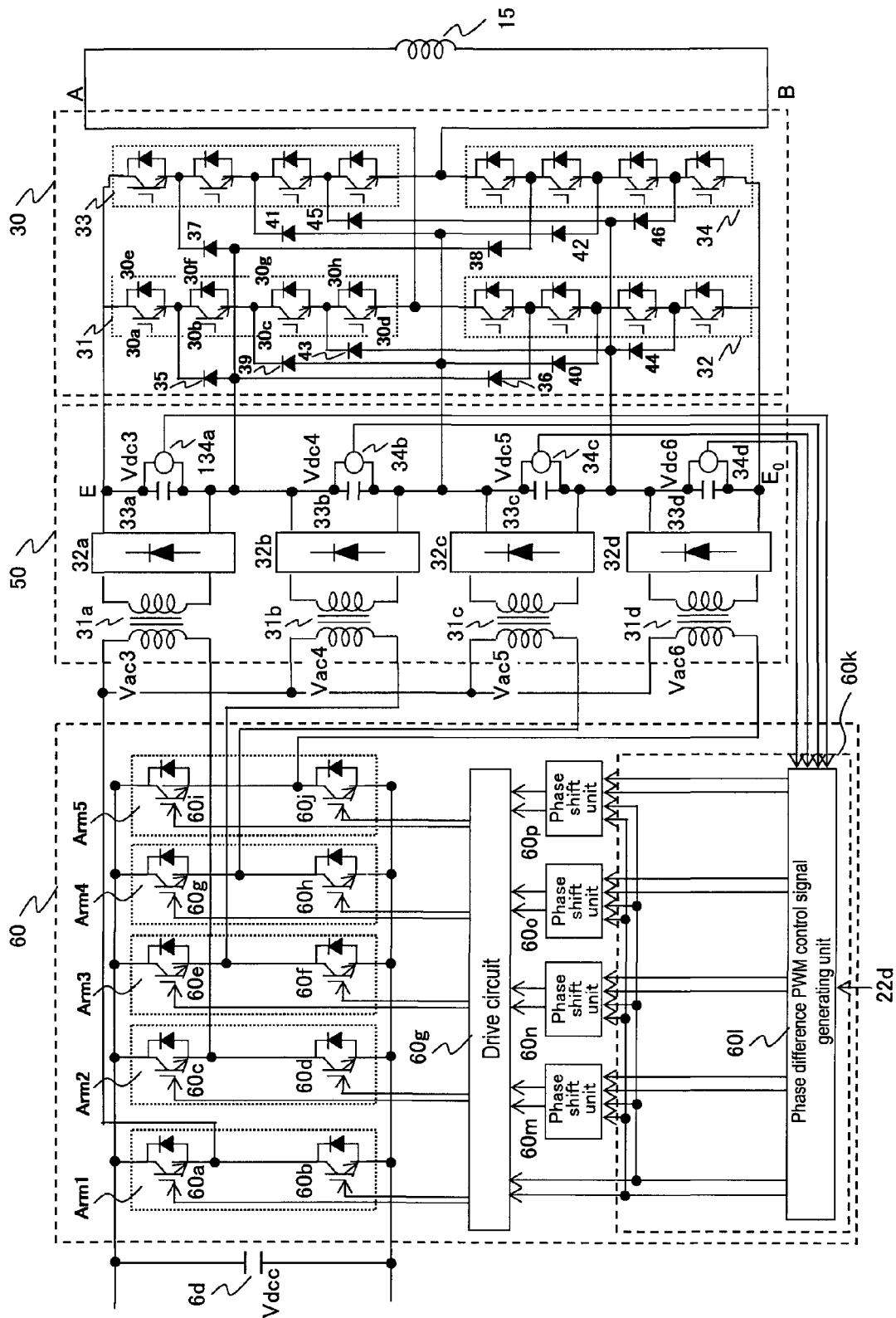
FIG. 6 is a circuit configuration diagram of a major part of a power source device representing a second embodiment according to the present invention, which is applied to gradient magnetic field coils, as a load thereof, of an MRI apparatus.

FIG. 6 is a circuit constitution diagram of a gradient magnetic field power source device for an MRI apparatus representing a second embodiment of a power source device according to the present invention.

Among the constitutional elements for generating a high DC voltage, since the constitution up to the step up chopper circuit 6 is the same as that in the first embodiment as shown in FIG. 1, in FIG. 6, only a phase shift inverter circuit 60 and an AC-DC step up and converting unit 50 are illustrated, and as the multi level PWM inverter circuit receiving the output of the AC-DC step up and converting unit 50, a multi level PWM inverter circuit 30 of 5 levels is used and to which output side the X axis coil 15 is connected as the load thereof. Further, the semiconductor switching control device for the circuit 30 and a circuit for driving the semiconductor switches in the multi level PWM inverter circuit 30 after amplifying the output signal from the device above are omitted.

Still further, although like multi level PWM inverter circuit 30 of 5 levels is used for the Y axis coil 16 and the Z axis coil 17, herein, only the case in connection with the X axis coil 15 will be explained.

In the multi level PWM inverter circuit 30 of 5 levels, a DC voltage power source of 5 levels from 0 level, 1/4 level, 2/4 level (=1/2 level), 3/4 level and the maximum level of 4/4 level is required as the DC power sources.

In the second embodiment, in order to obtain these four same DC voltages, the output voltage Vdcc (voltage at the fourth smoothing capacitor 6d) from the step up type chopper circuit 6 as shown in FIG. 1 is converted into four AC voltages by the phase shift inverter circuit 60, and the AC voltages are converted into DC by the AC-DC step up and converting unit 50.

The phase shift inverter circuit 60 is constituted by being provided with five arms of an arm 1 including semiconductor 60a and 60b, an arm 2 including semiconductor 60c and 60d, an arm 3 including semiconductor 60e and 60f, an arm 4 including semiconductor 60g and 60h and an arm 5 including semiconductor 60i and 60j, four full bridge inverter circuits of a first full bridge inverter circuit constituted by the arms 1 and 2, a second full bridge inverter circuit constituted by the arms 1 and 3, a third full bridge inverter circuit constituted by the arms 1 and 4, a fourth full bridge inverter circuit constituted by the arms 1 and 5, a third switching control device 60k for performing switching control of the semiconductor switches in these full bridge inverter circuits and a drive circuit 60g for driving the semiconductor switches after amplifying the output from the third switching control device 60k.

Further, a diode is connected in antiparallel to the respective semiconductor switches 60a~60j.

The third switching control device 60k is constituted by a phase difference PWM control signal producing unit 60l which produces a control signal for meeting the DC power source voltage to the multi level PWM inverter circuit 30 of 5 levels with the third voltage command value 22d outputted from the sequencer 22 in the MRI apparatus and a third phase shift unit 60m, a fourth phase shift unit 60n, a fifth phase shift unit 60o and a third phase shift unit 60p each shifts the phase of the signal produced by the phase difference PWM control signal producing unit 60i in a delayed phase or an advanced phase.

With the four full bridge inverter circuits in which the arm 1 is in common for all of the full bridge inverter circuits, the conduction control of the semiconductor switches is performed by making use of one of the first, second and third control methods which are explained in connection with the first embodiment as shown in FIG. 1 to obtain four AC voltages of a same value.

Namely, with respect to the conduction phase of the semiconductor switches in the arm 1, the corresponding semiconductor switches in the arms 2~5 are conduction controlled in a delayed phase or in an advance phase, thereby, the input DC voltage Vdcc is converted to an AC voltage Vac3 by the first full bridge inverter circuit constituted by the arms 1 and 2, the input DC voltage Vdcc is converted to an AC voltage Vac4 by the second full bridge inverter circuit constituted by the arms 1 and 3, the input DC voltage Vdcc is converted to an AC voltage Vac5 by the third full bridge inverter circuit constituted by the arms 1 and 4 and the input DC voltage Vdcc is converted to an AC voltage Vac6 by the fourth full bridge inverter circuit constituted by the arms 1 and 5, and these converted AC voltages are respectively inputted to the input sides of four insulating transformers 31a, 31b, 31c and 31d in the AC-DC step up and converting unit 50.

In the AC-DC step up and converting unit 50, the four AC voltages Vac3~Vac6 converted by the phase shift inverter circuit 60 are stepped up by the insulating transformers 31a, 31b, 31c and 31d while insulating each other, these stepped up AC voltages are converted into DC by the AC-DC converters (full wave rectifier) 32a, 32b, 32c and 32d, these converted DC voltages are smoothed by the smoothing capacitors 33a, 33b, 33c and 33d to obtain four DC voltages Vdc3, Vdc4, Vdc5 and Vdc6, and these DC voltages are used as the DC power sources for the multi level PWM inverter circuit 30 of 5 levels.

In order to keep these four DC voltages Vdc3, Vdc4, Vdc5 and Vdc6 at a stable voltage of a same value with no variation, the voltages Vdc3, Vdc4, Vdc5 and Vdc6 are detected by insulating voltage detectors 34a, 34b, 34c and 34d while insulating each other, which are fed back to the third switching control device 60k so as to meet the DC voltages Vdc3, Vdc4, Vdc5 and Vdc6 with the third voltage command value 22d as explained previously.

Such full bridge inverter circuits for controlling the four AC voltages independently require 16 pieces of semiconductor switches conventionally, however, 10 pieces of semiconductor switches are enough for the second embodiment of the present invention, therefore, the number of the semiconductor switches and of the circuits for driving these semiconductor switches are reduced.

Further, as has been explained in connection with the first embodiment, by making use of any one of the first, second and third control methods for the conduction control of the semiconductor switches, the heat radiating installation in view of the losses caused in the semiconductor switches in the respective arms is optimized, the surge voltage suppressing means is minimized and proper semiconductor switches are selected, thereby, a small sized and inexpensive inverter circuit can be realized.

The multi level PWM inverter circuit 30 of 5 levels is constituted in such a manner that to the inputs thereof DC voltage sources E and E0 (voltage=Vdc3+Vdc4+Vdc5+Vdc6) are connected and any voltage waveforms are outputted at output terminals A and B, and further includes four sets of arms 31~34 constituted by connecting in series four pairs of semiconductor switches 30a, 30b, 30c and 30d and diodes 30e, 30f, 30g and 30h connected in antiparallel thereto, and the four sets of arms are connected in full bridges.

Between the connection point of the smoothing capacitor 33a and the smoothing capacitor 33b and the respective connection points of the semiconductor switches 30a and 30b in the respective arms 31~34 in the full bridge structure, diodes 35~38 are respectively connected, further, between the connection point of the smoothing capacitor 33b and the smoothing capacitor 33c and the respective connection points of the semiconductor switches 30b and 30c in the respective arms 31~34, diodes 39~42 are respectively connected, and likely between the connection point of the smoothing capacitor 33c and the smoothing capacitor 33d and the respective connection points of the semiconductor switches 30c and 30d in the respective arms 31~34, diodes 43~46 are respectively connected.

Herein, when the semiconductor switches 30a~30d in the arm 31 are rendered conductive, voltage +E is outputted at the output terminal A, when the semiconductor switches 30b~30d in the arm 31 and the semiconductor switch 30a in the arm 32 are rendered conductive, voltage +E 3/4 is outputted at the output terminal A, when the semiconductor switches 30c and 30d in the arm 31 and the semiconductor switches 30a and 30b in the arm 32 are rendered conductive, voltage +E 1/2 is outputted at the output terminal A, when the semiconductor switch 30d in the arm 31 and the semiconductor switch 30a~30c in the arm 32 are rendered conductive, voltage +E 1/4 is outputted at the output terminal A, further, when the semiconductor switches 30a~30d in the arm 32 are rendered conductive, voltage 0 is outputted at the output terminal A, in this manner, voltages of five levels can be outputted at the output terminal A.

Further, the above is true with regard to the output terminal B, resultantly, nine voltages from −E to +E are outputted as voltages between the output terminals A and B.

Further, through performing the PWM control thereon any desired voltages from −E to +E can be outputted.

Since 5 level PWM inverter circuit 30 divides the DC voltage source between E~E0 into four voltages Vdc3, Vdc4, Vdc5 and Vdc6, the respective arms 31~34 likely divide the same with the four semiconductor switches 30a~30d and the respective connection points thereof are connected via the diodes 35~46, thereby, only the divided DC voltage component is applied to the respective semiconductor switches 30~30d, accordingly, even when semiconductor switches having a low withstand voltage are used, a large output can be obtained.

Figure 7:
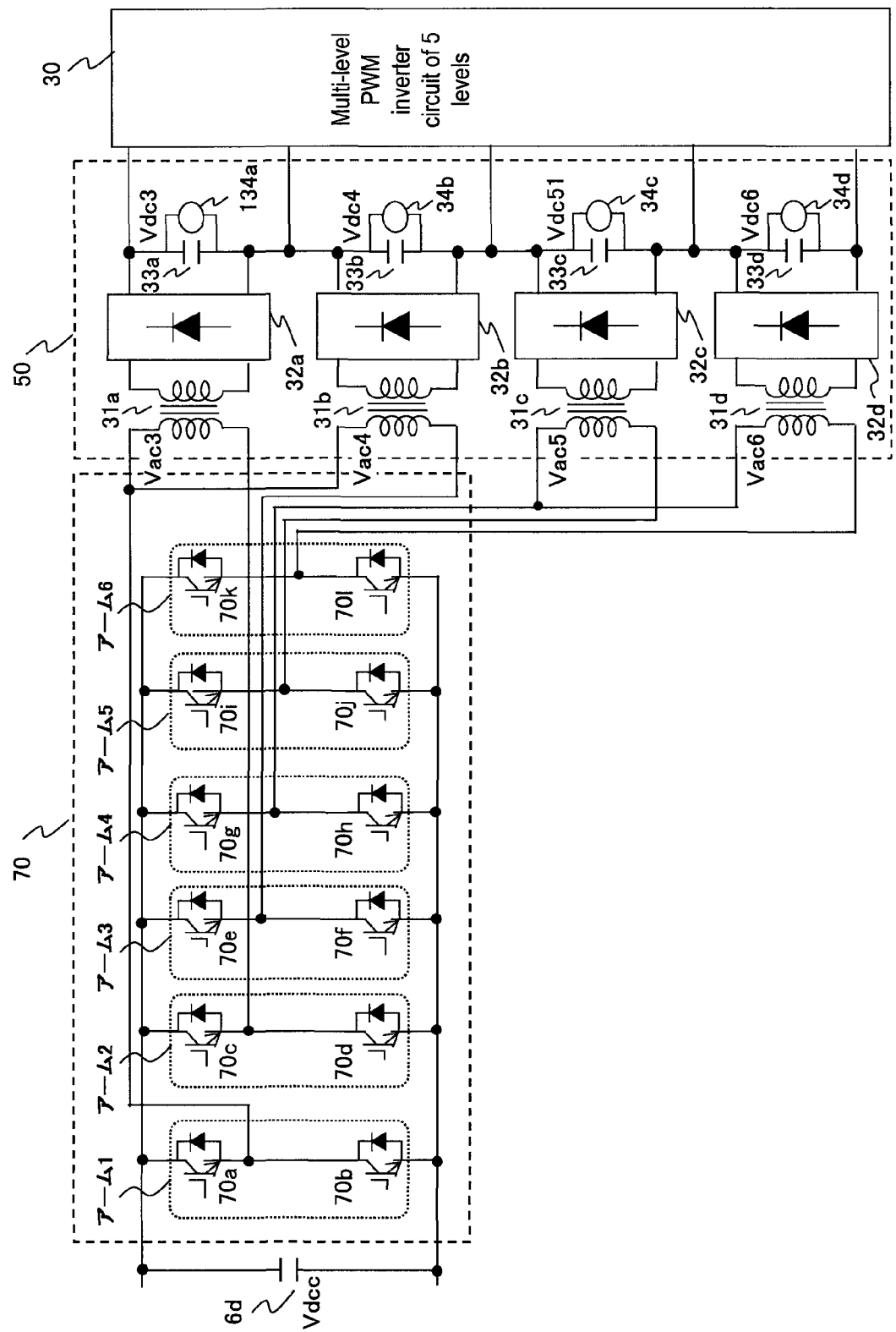
FIG. 7 is a circuit configuration diagram of a major part of a power source device representing a third embodiment according to the present invention, which is applied to gradient magnetic field coils, as a load thereof, of an MRI apparatus.

FIG. 7 is a circuit constitution diagram of a gradient magnetic field power source device for an MRI apparatus representing a third embodiment of a power source device according to the present invention.

In the third embodiment, since only a major portion of a phase shift inverter circuit 70 is different from that of the second embodiment as shown in FIG. 6 and the others thereof are the same as those in the second embodiment, herein, only the constitution of the phase shift inverter circuit 70 will be explained.

The phase shift inverter circuit 70 in FIG. 7 uses two sets of phase shift inverter circuits 7 in the first embodiment as shown in FIG. 1 and converts the output voltage Vdcc from the step up chopper circuit 6 into four voltages Vdc3, Vdc4, Vdc5 and Vdc6.

Namely, with the arm 1 formed by semiconductor switches 70a and 70b, the arm 2 formed by semiconductor switches 70c and 70d and the arm 3 formed by semiconductor switches 70e and 70f, two sets of full bridge inverter circuits are constituted, and with the arm 4 formed by semiconductor switches 70g and 70h, the arm 5 formed by semiconductor switches 70i and 70j and the arm 6 formed by semiconductor switches 70k and 70l, two sets of full bridge inverter circuits are constituted.

In the two sets of full bridge inverter circuits constituted by the arms 1~3, a first full bridge inverter circuit is constituted by the arms 1 and 2, a second full bridge inverter circuit is constituted by the arms 1 and 3, and the arm 1 is used in common for the first and second full bridge inverter circuits.

Likely, in the two sets of full bridge inverter circuit constituted by the arms 4~6, a third full bridge inverter circuit is constituted by the arms 4 and 5, a fourth full bridge inverter circuit is constituted by the arms 4 and 6, and the arm 4 is used in common for the third and fourth full bridge inverter circuits.

With the four full bridge inverter circuits, the conduction control of the semiconductor switches is performed by making use of one of the first, second and third control methods which are explained in connection with the first embodiment as shown in FIG. 1 to obtain four AC voltages of a same value.

Namely, with respect to the conduction phase of the semiconductor switches in the arm 1, the corresponding semiconductor switches in the arms 2 and 3 are conduction controlled in a delayed phase or in an advanced phase, thereby, the input DC voltage Vdcc is converted to an AC voltage Vac3 by the first full bridge inverter circuit constituted by the arms 1 and 2, the input DC voltage Vdcc is converted to an AC voltage Vac4 by the second full bridge inverter circuit constituted by the arms 1 and 3.

Likely, with respect to the conduction phase of the semiconductor switches in the arm 4, the corresponding semiconductor switches in the arms 5 and 6 are conduction controlled in a delayed phase or in an advanced phase, the input DC voltage Vdcc is converted to an AC voltage Vac5 by the third full bridge inverter circuit constituted by the arms 4 and 5 and the input DC voltage Vdcc is converted to an AC voltage Vac6 by the fourth full bridge inverter circuit constituted by the arms 4 and 6.

Such full bridge inverter circuit for controlling the four AC voltages independently requires 16 pieces of semiconductor switches conventionally, however, 12 pieces of semiconductor switches are enough for the third embodiment of the present invention, therefore, the number of the semiconductor switches and of the circuits for driving these semiconductor switches are reduced.

Further, by making use of any one of the first, second and third control methods for the conduction control of the semiconductor switches, the heat radiating installation in view of the losses caused in the semiconductor switches in the respective arms is optimized, the surge voltage suppressing means is minimized and proper semiconductor switches are selected, thereby, a small sized and inexpensive inverter circuit can be realized.

FIG. 8 is a fourth embodiment of a power source device according to the present invention in which the step up type chopper circuit 6 in the DC high voltage power source for the multi level PWM inverter circuit of 3 levels for the first embodiment and 5 levels for the second and third embodiments is improved and shows a circuit constitutional diagram of a fourth AC-DC converter 80 which has a function of converting the AC voltage from the commercial three phase AC voltage source 3 as well as full wave rectifying the three phase AC power source voltage and stepping up to a higher voltage than that obtained when smoothing the rectified voltage, and the DC voltage stepped up by the converter 80 is applied as the DC power source for the phase shift inverter circuits 7, 60 and 70.

The fourth AC-DC converter 80 as shown in FIG. 8 is constituted by a three phase full wave rectifying circuit formed by self extinguishable semiconductor switches 80a~80f of IGBTs and diodes 80g~80l connected in antiparallel thereto, reactors 80m, 80n and 80o connected between the AC input terminals of the three phase full wave rectifying circuit and the three phase AC power source 3, a smoothing capacitor 80p for smoothing the output voltage from the three phase full wave rectifying circuit, a voltage detector 80q for detection the voltage at the smoothing capacitor 80q, a fourth switching control device 80r which performs switching control of the semiconductor switches so that the detection value of the voltage detector 80q meets with the first voltage command value 22a from the sequencer 22 in the MRI apparatus and a circuit 80s which amplifies a switching control signal outputted from the switching control device 80r to a predetermined value and drives the semiconductor switches 80a~80f.

As disclosed in JP-A-7-65987, the fourth AC-DC converter 80 performs pulse width modulation control (PWM control) on the semiconductor switches 80a~80f so that the detection value of the voltage detector 80q meets with the first voltage command value 22a from the sequencer 22 in the MRI apparatus, stores the electro magnetic energy in the reactors 80m, 80n and 80o and by discharging the electro magnetic energy in the smoothing capacitor 80p charges the smoothing capacitor 80p at a voltage higher than that of the AC power source.

Namely, the voltage is stepped up to a voltage, for example, about 846 [V] as stepped up by the step up type chopper circuit 6 in the first embodiment.

Further, through provision of a phase current and phase voltage detector 80t for detecting the phase current and the phase voltage of the three phase AC power source 3, the fourth AC-DC converter 80 can meet the phases of phase current with the phase voltage of the AC power source by performing the pulse width modulation control on the semiconductor switches 80a~80f in response to a phase difference between the phase current and the phase voltage of the AC power source and an error between the output voltage of the smoothing capacitor 80p and the set value 22a (the first voltage command value), thereby, such advantages can be obtained that the power factor is increased and the apparent power is decreased, thus, the current required to be flown through the fourth AC-DC converter 80 can be reduced as well as the capacity of the three phase AC power source installation can also be reduced.

As has been explained above, according to the fourth embodiment of the present invention, such advantages are obtained that the size and cost of the DC high voltage power source for the gradient magnetic field power source device making use of the multi level PWM inverter circuit can be reduced as well as the capacity of the three phase AC power source installation can also be reduced.

Further, in the above embodiments, an example is explained in which the stabilization is performed by the feed back controlling (to the phase shift inverter circuits 7, 60, 70, the step up type chopper circuit 6 and the fourth AC-DC converter 80) the DC power source voltage to the multi level PWM converter circuit, however, since the control measure for meeting the current flowing through the gradient magnetic field coil representing the load with the current command values 22c1, 22c2 and 22c3 is provided, when the variation of the DC power source caused due to voltage variation of the commercial AC power source and others is in a predetermined range, the feed back control can be dispensed with.

Accordingly, the feed back control of the DC power source voltage to the multi level PWM inverter circuit can be applied depending on the necessity.

Further, in the above embodiments, an example is explained in which as the semiconductor switches the IGBTs are used for the fourth AC-DC converter 80, the step up type chopper circuit 6, the phase shift inverter circuit 7, 60, 70 and the multi level PWM inverter circuit, however, the present invention is not limited thereto, and in addition to the IGBTs, semiconductor switches such as MOSFETs and bipolar transistors can be used depending on the use thereof.

Still further, in the above embodiments, as the current amplifier, examples of the multi level PWM inverter circuits of 3 levels and 5 levels are explained, however, the present invention is not limited thereto, and a multi level PWM inverter circuit of more than 5 levels can be used to which a DC power source constituted according to the idea of the above embodiments is applied.

Still further, in the above embodiments, an example is explained in which as the load the gradient magnetic field coil in the MRI apparatus is connected to the power source device according to the present invention, the coil for generating the static magnetic field and the high frequency magnetic field can be connected and used as the load.

Still further, in the above embodiments, an example is illustrated in which number of DC voltages produced by the AC-DC step up and converting unit is an even number, however, DC voltages of odd number can be produced thereby.

The invention claimed is:

1. A power source device comprising: a DC voltage power source means constituted by connecting in series plural DC voltage sources, a current amplifying means of a multi level inverter using DC voltage of the DC voltage power source means as a power source, at the output of the current amplifying means a load is connected, and a current control means that controls the current amplifying means so that a current flowing through the load assumes a current command value, wherein the DC voltage power source means comprises an AC-DC converting and stepping up means that converts a commercial AC power source voltage to a DC voltage and steps up the converted DC voltage, a DC-AC converting means that converts the DC voltage stepped up by the previous means to plural AC voltages and plural insulating transformers which step up the plural AC voltages converted by the converting means while insulating each other, and is constituted by connecting in series plural DC voltage sources that are obtained by converting the output voltages of the transformers to DC.

2. A magnetic resonance imaging apparatus using a power source device comprising a DC voltage power source means constituted by connecting in series plural DC voltage sources, a current amplifying means of a multi level inverter using DC voltage of the DC voltage power source means as a power source, at the output of the current amplifying means a load is connected, and a current control means that controls the current amplifying means so that a current flowing through the load assumes a current command value, wherein the load is a coil for generating magnetic field for the magnetic resonance imaging apparatus and as the power source device, the power source device according to claim 1 is used.

3. A power source device comprising: a DC voltage power source means constituted by connecting in series plural DC voltage sources, a current amplifying means of a multi level inverter using DC voltage of the DC voltage power source means as a power source, at the output of the current amplifying means a load is connected, and a current control means that controls the current amplifying means so that a current flowing through the load assumes a current command value, wherein the DC voltage power source means includes an AC-DC converting and stepping up means that converts a commercial AC power source voltage to a DC voltage and steps up the converted DC voltage, a DC-AC converting means that converts the DC voltage stepped up by the previous means to plural AC voltages and plural insulating transformers which step up the plural AC voltages converted by the converting means while insulating each other, and is constituted by connecting in series plural DC voltage sources that are obtained by converting the output voltages of the transformers to DC, and the DC-AC converting means includes not less than two sets of full bridge inverter circuits in which an arm is constituted by connecting in series two switch means each is constituted by a semiconductor switch and a diode connected in antiparallel to the semiconductor switch and at least three arms are connected in parallel and which are constituted by at least one common arm among the plural arms and the remaining arms and a phase difference control means which controls respective semiconductor switches in the common arm of the respective full bridge inverter circuits by providing a conduction phase different from that of the corresponding semiconductor switches in the remaining arms.

4. A power source device according to claim 3, wherein the phase difference control means controls the conduction phase of the semiconductor switches in the remaining arms in a delayed phase and/or in an advanced phase with respect to the conduction phase of the semiconductor switches in the common arm.

5. A power source device according to claim 3, wherein the AC-DC converting and stepping up means includes means for converting the commercial AC power source voltage to DC, a step up type chopper circuit that steps up the DC voltage converted by the previous means and a conduction rate control means that controls the conduction rate of the semiconductor switches in the chopper circuit.

6. A power source device according to claim 3, wherein the AC-DC converting and stepping up means includes a bridge circuit in which plural pairs of semiconductor switches are connected in parallel, diodes each connected in antiparallel to the respective semiconductor switches in the plural pairs, a reactor connected between AC input terminals of the bridge circuit and the commercial AC power source and a pulse width modulation control means that performs pulse width modulation control on the semiconductor switches.

7. A power source device according to claim 4, wherein the phase difference control means is further provided with a DC voltage detecting means that detects a DC voltage of the DC voltage power source means, and the phase difference is feed back controlled so that a difference between a detection value detected by the previous means and a first target voltage command value assumes zero.

8. A power source device according to claim 5, wherein the conduction rate control means is further provided with means for detecting an output voltage of the step up voltage type chopper circuit and the conduction rate of the semiconductor switches is feed back controlled so that a difference between a detection value detected by the previous means and a second target voltage command value assumes zero.

9. A power source device according to claim 6, wherein the pulse width modulation control means is further provided with means for detecting an output voltage of the AC-DC converting and voltage stepping up means and the conduction pulse width of the semiconductor switches is feed back controlled so that a difference between a detection value detected by the previous means and a third target voltage command value assumes zero.

10. A power source device according to claim 9, wherein the pulse width modulation control means is further provided with means for detection a phase voltage and a phase current of the commercial AC power source and controls the phases of the phase voltage and the phase current to meet each other.

11. A magnetic resonance imaging apparatus using a power source device comprising a DC voltage power source means constituted by connecting in series plural DC voltage sources, a current amplifying means of a multi level inverter using DC voltage of the DC voltage power source means as a power source, at the output of the current amplifying means a load is connected, and a current control means that controls the current amplifying means so that a current flowing through the load assumes a current command value, wherein the load is a coil for generating magnetic field for the magnetic resonance imaging apparatus and as the power source device, the power source device according to claim 3 is used.

12. A power source device comprising: an AC-DC converting and stepping up unit at input terminals of which a commercial three phase AC power source is connected, a DC-AC converting unit at input terminals of which output terminals of the AC-DC converting and stepping up unit are connected, another AC-DC stepping up and converting unit at input terminals of which output terminals of the DC-AC converting unit are connected and a multi-level diode clamped type PWM inverter at input terminals of which output terminals of the another AC-DC stepping up and converting unit are connected and at output terminals of which a load is connected, wherein the DC-AC converting unit is constituted by a phase shift inverter which includes not less than two sets of full bridge inverter circuits in which an arm is constituted by connecting in series two switch means each is constituted by a semiconductor switch and a diode connected in antiparallel with the semiconductor switch and at least three arms are connected in parallel and which are constituted by at least one common arm among the plural arms and the remaining arms and a phase difference control means which controls respective semiconductor switches in the common arm of the respective full bridge inverter circuits by providing a conduction phase different from that of the corresponding semiconductor switches in the remaining arms, wherein the phase shift inverter includes two full bridge inverter circuits and each is constituted by combining the common arm and one of the remaining two arms to thereby produce two output AC voltages.

13. A power source device comprising: an AC-DC converting and stepping up unit at input terminals of which a commercial three phase AC power source is connected, a DC-AC converting unit at input terminals of which output terminals of the AC-DC converting and stepping up unit are connected, another AC-DC stepping up and converting unit at input terminals of which output terminals of the DC-AC converting unit are connected and a multi-level diode clamped type PWM inverter at input terminals of which output terminals of the another AC-DC stepping up and converting unit are connected and at output terminals of which a load is connected, wherein the DC-AC converting unit is constituted by a phase shift inverter which includes not less than two sets of full bridge inverter circuits in which an arm is constituted by connecting in series two switch means each is constituted by a semiconductor switch and a diode connected in antiparallel with the semiconductor switch and at least three arms are connected in parallel and which are constituted by at least one common arm among the plural arms and the remaining arms and a phase difference control means which controls respective semiconductor switches in the common arm of the respective full bridge inverter circuits by providing a conduction phase different from that of the corresponding semiconductor switches in the remaining arms, wherein the phase shift inverter includes four full bridge inverter circuits and each is constituted by combining the common arm and one of the remaining four arms to thereby produce four output AC voltages.

14. A power source device comprising: an AC-DC converting and stepping up unit at input terminals of which a commercial three phase AC power source is connected, a DC-AC converting unit at input terminals of which output terminals of the AC-DC converting and stepping up unit are connected another AC-DC stepping up and converting at unit terminals of which output terminals of the DC-AC converting unit are connected and a multi-level diode clamped type PWM inverter at input terminals of which output terminals of the another AC-DC stepping up and converting unit are connected and at output terminals of which a load is connected, wherein the DC-AC converting unit is constituted by a phase shift inverter which includes not less than two sets of full bridge inverter circuits in which an arm is constituted by connecting in series two switch means each is constituted by a semiconductor switch and a diode connected in antiparallel with the semiconductor switch and at least three arms are connected in parallel and which are constituted by at least one common arm among the plural arms and the remaining arms and a phase difference control means which controls respective semiconductor switches in the common arm of the respective full bridge inverter circuits by providing a conduction phase different from that of the corresponding semiconductor switches in the remaining arms, wherein the phase shift inverter includes four full bridge inverter circuits and each is constituted by one of two common arms and one of the remaining two arms to be combined to the one of two common arms to thereby produce four output AC voltages.

15. A power source device according to claim 14, wherein an operating frequency of the phase shift inverter is about 20 kHz.

* * * * *